(12) United States Patent
Kitamura

(10) Patent No.: US 9,680,033 B2
(45) Date of Patent: Jun. 13, 2017

(54) SEMICONDUCTOR DEVICE AND MANUFACTURING METHOD THEREOF

(75) Inventor: Shoji Kitamura, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 559 days.

(21) Appl. No.: 13/197,869

(22) Filed: Aug. 4, 2011

(65) Prior Publication Data

US 2012/0032305 A1 Feb. 9, 2012

(30) Foreign Application Priority Data

Aug. 4, 2010 (JP) .................... 2010-175498

(51) Int. Cl.
*H01L 29/47* (2006.01)
*H01L 29/861* (2006.01)
(Continued)

(52) U.S. Cl.
CPC ........ *H01L 29/8611* (2013.01); *H01L 29/167* (2013.01); *H01L 29/32* (2013.01);
(Continued)

(58) Field of Classification Search
CPC ....... H01L 29/32; H01L 29/36; H01L 29/861; H01L 29/872
(Continued)

(56) References Cited

U.S. PATENT DOCUMENTS 5,945,692 A * 8/1999 Yano .................. H01L 23/3171
257/139
5,981,984 A * 11/1999 Iwaana ............... H01L 29/7455
257/138

(Continued)

FOREIGN PATENT DOCUMENTS

JP 50-5024 2/1975
JP 56-104476 A 8/1981
(Continued)

OTHER PUBLICATIONS

Y.K. Kwon et al.; "Properties of platinum-associated deep levels in silicon"; Journal of Applied Physics, 61 (3), Feb. 1, 1987; pp. 1056-1058.
(Continued)

*Primary Examiner* — Jerome Jackson, Jr.
*Assistant Examiner* — John Lin
(74) *Attorney, Agent, or Firm* — Rossi, Kimms & McDowell LLP

(57) ABSTRACT

A semiconductor device and a manufacturing method thereof is disclosed in which the semiconductor device includes a p-type anode layer formed by a transition metal acceptor transition, and the manufacturing process is significantly simplified without the breakdown voltage characteristics deteriorating. An inversion advancement region inverted to a p-type by a transition metal acceptor transition, and in which the acceptor transition is advanced by point defect layers, is formed on the upper surface of an n-type drift layer. The inversion advancement region configures a p-type anode layer of a semiconductor device of the invention. The transition metal is, for example, platinum or gold. An n-type semiconductor substrate with a concentration higher than that of the n-type drift layer is adjacent to the lower surface of the n-type drift layer.

22 Claims, 20 Drawing Sheets

(51) Int. Cl.

| | | |
|---|---|---|
| *H01L 29/167* | (2006.01) | |
| *H01L 29/32* | (2006.01) | |
| *H01L 29/36* | (2006.01) | |
| *H01L 29/66* | (2006.01) | |
| H01L 29/06 | (2006.01) | |
| H01L 29/40 | (2006.01) | |

(52) U.S. Cl.
CPC ........ *H01L 29/36* (2013.01); *H01L 29/66136* (2013.01); *H01L 29/0619* (2013.01); *H01L 29/402* (2013.01)

(58) Field of Classification Search
USPC .......... 257/471, 472, 484, E29.338; 438/570
See application file for complete search history.

(56) References Cited

U.S. PATENT DOCUMENTS

| | | | | |
|---|---|---|---|---|
| 6,175,143 | B1 * | 1/2001 | Fujihira | ............. H01L 29/0692 257/471 |
| 6,521,536 | B1 * | 2/2003 | Robinson | ................ B24B 21/04 257/E21.244 |

FOREIGN PATENT DOCUMENTS

| | | |
|---|---|---|
| JP | 06-085290 A | 3/1994 |
| JP | 09-008050 A | 1/1997 |
| JP | 09-205217 | 8/1997 |
| JP | 09-260658 A | 10/1997 |
| JP | 2000-223719 | 8/2000 |
| JP | 2002-231968 A | 8/2002 |
| JP | 2003-152197 | 5/2003 |
| JP | 2003-282575 A | 10/2003 |
| JP | 2006-196775 | 7/2006 |

OTHER PUBLICATIONS

Bei Deng et al.; "Improvement of Electrical Characteristics of Pt-Diffused Devices"; Jpn. Journal Applied Physics, vol. 34 (1995), pp. 2969-2973.

Japanese Office Action cited in Japanese counterpart application No. JP2010-175498, dated Nov. 5, 2013. Partial English translation provided.

* cited by examiner

1 · · ·   n-TYPE SEMICONDUCTOR SUBSTRATE
2 · · ·   n-TYPE DRIFT LAYER
5 · · ·   p-TYPE ANODE LAYER
40 · · ·  POINT DEFECT LAYER
43 · · ·  INVERSION ADVANCEMENT REGION

FIG. 2
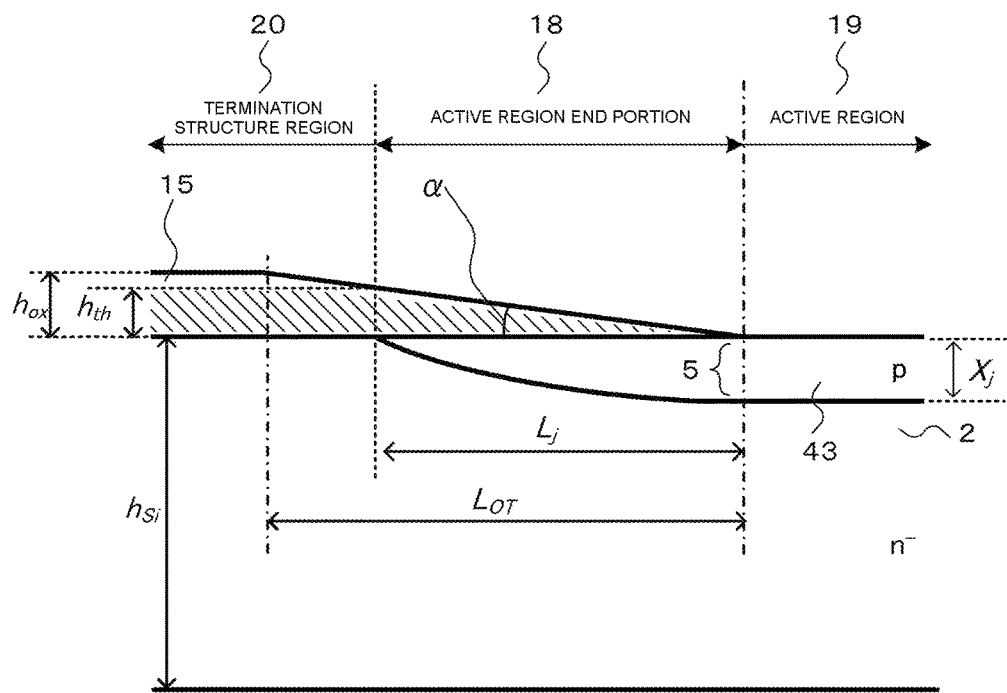
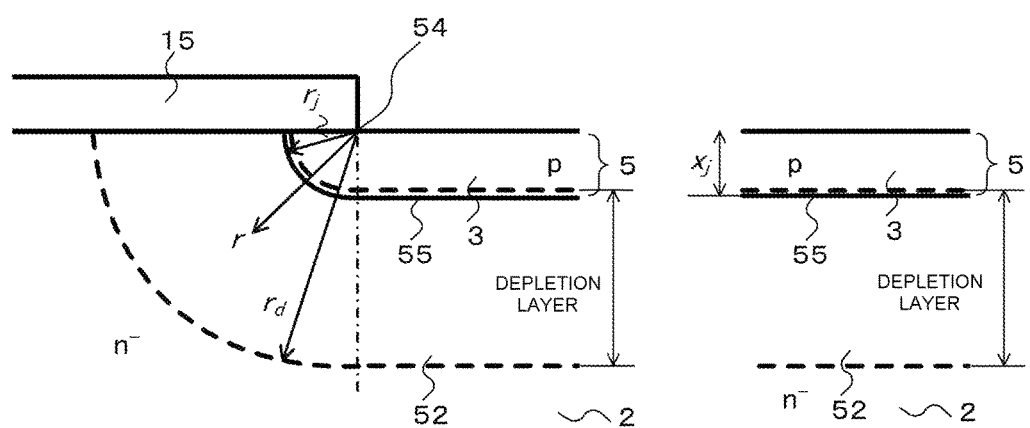
FIG. 3 A  FIG. 3 B

FIG. 23 A
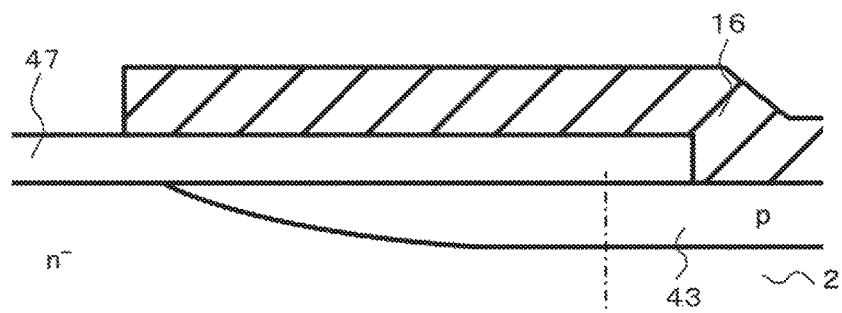
FIG. 23 B
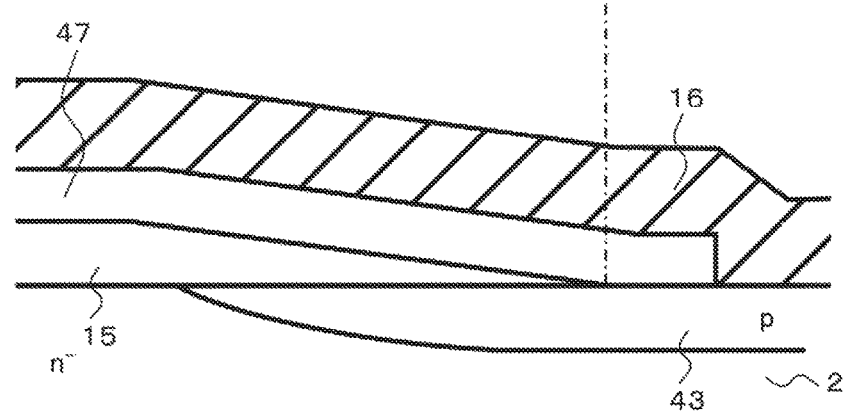
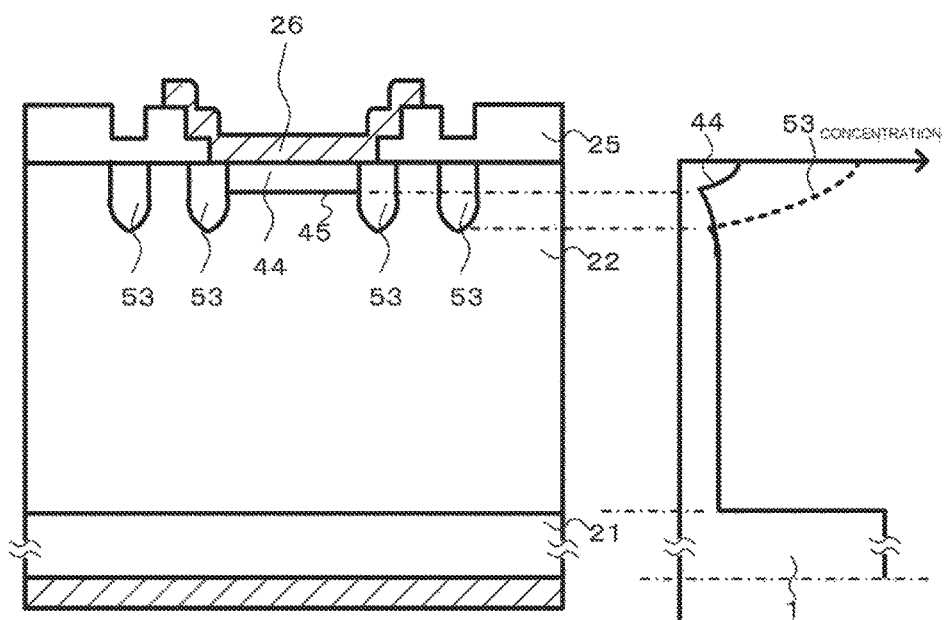
FIG. 24 A
(PRIOR ART)
FIG. 24 B
(PRIOR ART)

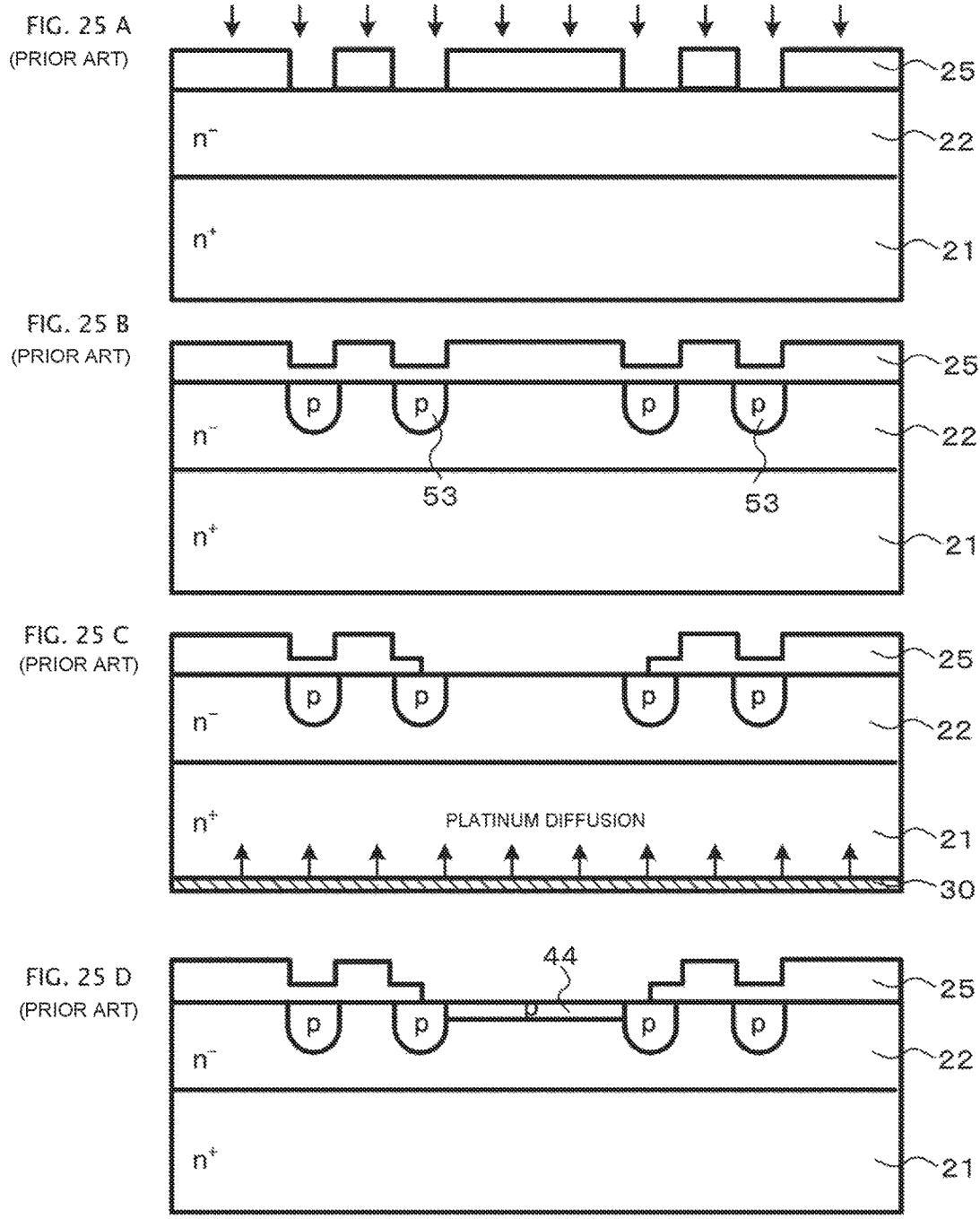

SEMICONDUCTOR DEVICE AND MANUFACTURING METHOD THEREOF

BACKGROUND OF THE INVENTION

A. Field of the Invention

The present invention relates to a semiconductor device and manufacturing method thereof, and in particular, relates to a diode used in a power source circuit, power conversion device, or the like, and to a manufacturing method thereof.

B. Description of the Related Art

Rectifier diodes utilizing a p-n junction of a silicon semiconductor are widely used, and in a high frequency switching application in particular, fast recovery diodes are widely used. These diodes are formed of a p-type anode layer and n-type cathode layer, and of an n-type drift layer (as this has a lower concentration than the anode and cathode layers, it is also called an i-layer or intrinsic region) for maintaining breakdown voltage at a high level, and exhibit rectifying characteristics owing to a p-n junction of the anode layer and drift layer. Furthermore, fast reverse recovery characteristics are obtained by introducing a transition metal into the drift layer, forming recombination centers, and controlling minority carrier lifetime. B (boron) is mainly used for the p-type anode layer, P (phosphorus) for the n-type drift layer, and P, As (arsenic), Sb (antimony), or the like, for the n-type cathode layer. Au (gold), Pt (platinum), Fe (iron), or the like, is used as the transition metal.

Also, as heretofore known technology, a p-n junction formation method that is not influenced by a p-type impurity diffusion method using boron has been proposed (JP-A-2002-231968). A sectional view of a typical example thereof is shown in FIGS. 24A and 24B. It is widely known that Pt diffused inside an n-type semiconductor substrate 21 and an n-type drift layer 22 has a U-shaped concentration distribution that segregates to the front surface or rear surface of the substrate, as shown in FIG. 27, and transition metals other than platinum are also distributed in the same way. The high concentration Pt segregated to the silicon surface becomes an acceptor, compensating the concentration of the n-type drift layer. For this reason, the n-type silicon surface inverts to a p-type, forming a p-type inversion region 44. The diode of FIGS. 24A and 24B utilizes the heretofore known p-type inversion region 44 that has inverted to the p-type in a p-type anode layer 45. According to this method, there is an advantage in that it is easily possible to form the p-type layer without introducing a heretofore known dopant impurity (B, aluminum, or the like) that becomes an acceptor, or diffusing at a temperature of 1,000° C. or more. Also, the Pt in the silicon surface vicinity is taken into a silicon oxide film 25 through a silicon (Si)-silicon oxide (SiO$_2$) film interface. As a result of this, as the Pt concentration in the silicon surface vicinity directly below the silicon oxide film 25 decreases, it is possible to selectively form a p-n junction in the aperture portion of the silicon oxide film 25.

A description will be given, using FIGS. 25A to 25E, of steps of manufacturing the diode of FIGS. 24A and 24B. FIGS. 25A to 25E are a flow diagram of steps for manufacturing the structure of FIGS. 24A and 24B. The silicon oxide film 25 for a boron ion implantation for forming a p-type guard ring region 53 is formed (FIG. 25A), and the p-type guard ring region 53 is formed with a boron ion implantation and a high temperature diffusion at 1,000° C. or more (FIG. 25B). Continuing, a region of the silicon oxide film 25 in which platinum is to be diffused is opened, a silica paste 30 including Pt is applied to the rear surface, and the Pt is diffused at a temperature on the order of 900° C. (FIG. 25C). When the Pt is diffused, the heretofore known p-type inversion region 44 is formed (FIG. 25D). Subsequently, an anode 26 and a cathode 27 are formed (FIG. 25E).

When using the method described in JP-A-2002-231968 of forming the p-n junction formation with a Pt diffusion, as previously described, the p-n junction is formed by a compensatory effect of the concentration of the Pt that has become an acceptor segregated to the silicon surface and the n-type impurity concentration in the n-type drift layer 22. For this reason, being affected by inconsistency in the Pt concentration profile in the silicon after diffusion, caused by inconsistency in conditions in the Pt diffusion step, there is a tendency for the depth of the p-n junction and the p-layer carrier concentration distribution to be unstable. In particular, when the n-type impurity concentration of the n-type drift layer is high (for example, in the case of a diode for a rated voltage in the 150 to 200 V class), the compensatory effect of the Pt that has become an acceptor becomes weak, meaning that the instability of the p-layer carrier concentration is marked. As the p-layer becomes the p-type anode layer, as previously described, there is a considerable effect on electrical characteristics such as breakdown voltage or leakage current when a reverse bias voltage is applied, or implantation efficiency when a forward bias voltage is applied. Therefore, as the p-type anode layer concentration distribution is unstable with the heretofore described manufacturing method, there is a problem in that the electrical characteristics fluctuate considerably.

Also, in comparison with a normal p-type diffusion layer formed by B or the like, the p-type anode layer formed from the heretofore known p-type inversion region 44 formed by the Pt acceptor transition has a smaller diffusion depth, and the concentration also tends to be lower. For this reason, the electric field intensity increases in the p-type anode layer in the vicinity of the oxide film aperture end portion when there is a reverse bias, and the breakdown voltage may decrease markedly. The reason for this is as follows. When B, which is normally used as an acceptor, is diffused, the form of the p-n junction in the end portion of the oxide film aperture portion formed on the surface layer of the silicon substrate, owing to diffusion thereof in a horizontal direction, becomes a cylindrical form or a spherical form. For this reason, when a reverse bias is applied to the p-n junction and a depletion layer spreads, the electric field intensity increases more in the end portion of the p-type anode layer, in accordance with the curvature radius thereof, than in a portion in which the p-n junction is flat (hereafter called a flat junction). As it is sufficient to increase the curvature radius of the p-n junction in order to suppress the increase in electric field intensity, it is sufficient in the case of B to increase the diffusion temperature, or increase the diffusion time. However, in the case of the p-type anode layer formed with the method using the Pt acceptor transition, the diffusion depth is small. This is because, while the thermal diffusion of B in silicon is a replacement type, Pt has an interstitial diffusion type, meaning that the diffusion coefficient of Pt is on the order of ten times greater than that of B at the same diffusion temperature. Therefore, Pt spreads through the whole of the depth direction of the silicon substrate in a short time and, when ignoring the segregation to the substrate surface layer, the Pt concentration distribution is virtually flat. Therefore, the curvature radius of the p-type anode layer horizontal direction diffusion portion is extremely small in comparison with a normal diffusion with B. As a result of this, the electric field intensity of the end portion of the p-type anode layer is liable to increase when there is a reverse bias, and a problem occurs in that the breakdown voltage of the element decreases, or the leakage current is unstable.

A method of countering the breakdown voltage decrease caused by the curvature radius of the p-n junction in the end portion of the p-type anode layer is described in JP-A-2002-231968. That is, as shown in FIGS. 24A and 24B, the end portion of the p-type anode layer 45 formed by the Pt acceptor transition is covered by a p-type guard ring region 53 which is deeper than the p-type anode layer 45. By so doing, it is possible to keep the electric field intensity of the end portion of the p-type anode layer 45 low. However, with this method, it is necessary to selectively form a p-type region (a guard ring, or the like), using B rather than Pt, in a region differing from the region in which the p-type anode layer formed by the Pt acceptor transition is formed. That is, the number of photolithography steps increases. With the manufacturing method illustrated in FIGS. 25A to 25E, a total of at least three photolithography steps are necessary, and three photomasks are needed. In accordance with the leaning toward energy saving in recent years, a reduction in steps and necessary materials is required in the diode fabrication process also. Therefore, in order to achieve a significant process contraction with the heretofore described manufacturing method, a review of the p-n junction formation method itself is essential.

The present invention is directed to overcoming or at least reducing the effects of one or more of the problems set forth above.

SUMMARY OF THE INVENTION

A method of stably fabricating a diode including a p-type anode layer formed by a transition metal acceptor transition is provided, which achieves a significant simplification of the diode fabrication process.

A first aspect of the invention is a semiconductor device, including a first semiconductor substrate of a first conductivity type, a second semiconductor layer of a second conductivity type, formed on one main surface side of the first semiconductor substrate so as to come into contact with the first semiconductor substrate, having an electrically activated transition metal, an anode formed on the one main surface so as to come into contact with the second semiconductor layer, a third semiconductor substrate of the first conductivity type provided on the other main surface of the first semiconductor substrate, and a cathode formed on the other main surface so as to come into contact with the third semiconductor substrate, wherein the second semiconductor layer includes point defects of a higher concentration than the concentration included in a condition of thermal equilibrium.

Characteristics of the structure of the semiconductor device according to the first aspect of the invention are the following two points, A1: point defects of a concentration higher than that at thermal equilibrium are introduced into the second semiconductor layer of the second conductivity type, A2: the second semiconductor layer of the second conductivity type has a transition metal which is in the silicon lattice position and is electrically activated.

According to the two characteristics, the transition metal moves into excessive point defects, mainly holes, formed on the one main surface of the semiconductor substrate and, compared with when the point defects have the concentration of a condition of thermal equilibrium, more easily enter the lattice position. As a result of this, by controlling the hole concentration, it is possible to increase the concentration of the transition metal that has become an acceptor, and to stably control the concentration distribution thereof. That is, there is an advancement effect on the transition metal acceptor transition. The heretofore described kind of advancement effect of the point defects on the transition metal acceptor transition is a new effect, no description of which is found in the related art.

Furthermore, a description will be given of main methods among more preferable methods of the first aspect of the invention. Other methods will be described in an embodiment of the invention.

Furthermore, it is preferable that the transition metal is platinum. Among transition metals, platinum has a high acceptor transition rate. For this reason, the acceptor transition is easily advanced by the holes, and the formation of the p-type anode layer is easy. Also, platinum is preferable because, as the level of the platinum recombination centers in silicon is near the conduction band, forming a shallow level, the leakage current decreases.

It is preferable that the point defects include any of B, Al (aluminum), Ga (gallium), or In (indium). When these elements are introduced, point defects, particularly holes and multi-holes, occur in silicon. Then, the elements themselves become acceptors in silicon. For this reason, the elements, while forming point defects, increase the concentration of the second semiconductor layer in the surface layer of the semiconductor substrate, contact with electrodes has a low resistance, and the characteristics are stable. Also, as the elements are introduced basically as point defects, a recombination center concentration in the second semiconductor layer also becomes higher than the thermal equilibrium concentration. Because of this, the lifetime of the minority carriers is short in the second semiconductor layer, where the concentration of the elements is high, and an introduction of minority carriers (holes in this case) into the first semiconductor layer is suppressed. As a result of this, the reverse recovery current of the diode is also reduced, and it becomes a soft recovery diode.

Next, a description will be given of main methods of manufacturing the semiconductor device according to the first aspect of the invention.

A semiconductor device manufacturing method according to a second aspect of the invention includes a step of introducing point defects into one main surface of a semiconductor substrate, and a step of advancing the electrical activation of the transition metal with the point defects by introducing a transition metal from the one main surface or the other main surface of the semiconductor substrate after the step of introducing the point defects.

Characteristics of the semiconductor device manufacturing method according to the second aspect of the invention are the following two points.

B1: the point defects are introduced into the one main surface of the semiconductor substrate, B2: the transition metal is introduced into the semiconductor substrate after the point defects are introduced.

According to B1, excessive point defects, mainly holes, are formed in the one main surface of the semiconductor substrate. Meanwhile, the transition metal introduced according to B2 carries out an interstitial diffusion, moving among crystal lattices formed by silicon atoms. Therefore, the transition metal is caught up by the point defects, particularly the holes, excessively introduced according to B1, enters the lattice position, and becomes an acceptor that supplies holes. As a result of this, it is possible to advance the transition metal acceptor transition in a region in which there is a high concentration of point defects. Also, as it is possible to form the second semiconductor layer with a concentration higher than that of the structure described in JP-A-2002-231968, it is possible to reduce the boron steps described in the same JP-A-2002-231968.

Furthermore, a description will be given of main methods among more preferable methods of the semiconductor device manufacturing method according to the second aspect of the invention. Other methods will be described in an embodiment of the invention.

It is preferable that the semiconductor device manufacturing method includes a step of forming an insulating oxide film on the one main surface of the semiconductor substrate, a step of introducing damage to the upper surface of the insulating oxide film, and a step of selectively etching the insulating oxide film to which the damage is introduced using a photolithography method, exposing the one main surface of the semiconductor substrate. Besides, these steps are performed before the step of introducing the point defects into the one main surface of the semiconductor substrate as described in B1.

Characteristics of a preferable configuration of the manufacturing method are the following three points, C1: damage is provided on the surface of the insulating film that forms a mask for selectively introducing the transition metal, C2: the insulating film is selectively wet etched using a photolithography method after the damage is provided, exposing the one main surface of the semiconductor substrate, C3: the step of introducing the point defects described in B1 into the exposed main surface is carried out.

Firstly, there is an increase in the etching rate of the wet etching carried out in C2 on the insulating film, particularly on the surface portion thereof, in whose surface the damage is provided according to C1. Herein, damage is a condition wherein a condition in which the bonding of atoms or molecules of the insulating film are cut, or a condition in which there are irregular scratches or irregularities over a longer distance (a so-called rough condition), is formed on the surface of a uniformly formed insulating film. As a result of this, the etching of the insulating film surface proceeds swiftly in accordance with the extent of the damage, and the surface takes on a tapered form, as will be described hereafter. With a wet etching in particular, the etchant can seep between the photo resist and the insulating film in accordance with the damage, and it is possible to form a tapered form with a gentler gradient. Then, by carrying out the step of C3, it is possible to form a cylindrical junction or spherical junction that reflects the tapered form.

Furthermore, taking the thickness of the insulating film to be $h_{ox}$, the thickness of the semiconductor substrate to be $h_{Si}$, the diffusion coefficient of the transition metal in the insulating film to be $D_{ox}$, and the diffusion coefficient of the transition metal in the semiconductor substrate to be $D_{Si}$, it is preferable that the $h_{ox}$, $h_{Si}$, $D_{ox}$, and $D_{Si}$ satisfy the following equation $$h_{OX} \geq h_{Si} \sqrt{\frac{D_{OX}}{S_{Si}}}$$
Equation 1

By satisfying Equation 1, it is possible to completely enclose the transition metal inside the selectively formed insulating film. By so doing, the transition metal ceases to be distributed to the interface of the semiconductor substrate that comes into contact with the insulating film. As a result of this, it is possible to introduce the transition metal in accordance with the form of the insulating film aperture portion, and a patterning of the second semiconductor layer is possible.

It is preferable that the introduction of damage into the insulating oxide film is a plasma treatment of the upper surface of the insulating oxide film.

By utilizing plasma, which is used in the etching of oxide films and silicon too, it is possible to provide damage completely and evenly to the insulating film surface over the whole of the silicon wafer.

In the semiconductor device manufacturing method, it is preferable that the step of the wet etching of the insulating oxide film includes a step of applying a photoresist and using a photolithography method after the introduction of the damage to the insulating oxide film to form a pattern, and a step of removing the insulating film using a wet etching, with the patterned photoresist as a mask, and an angle formed between a cross-section of the insulating oxide film in the end portion of the second semiconductor layer side and the second semiconductor layer is a tapered form smaller than that of an angle formed between the cross-section and the perpendicular direction of the upper surface of the second semiconductor layer by the removing step.

By providing the damage to the insulating film surface as previously described, it is possible for the cross-section to take on a tapered form. Herein, tapered means that the angle formed between the cross-section of the insulating film in the end portion of the second semiconductor layer side and the second semiconductor layer is a form smaller than that of an angle formed between the cross-section and the perpendicular direction of the upper surface of the second semiconductor layer. Utilizing a characteristic whereby the transition metal is taken into the insulating film, by giving the thickness of the insulating film a desired form or distribution, the transition metal is introduced into the silicon in accordance with the form of the insulating film. Therefore, by making the form of the end portion of the insulating film aperture portion the tapered form, the end portion of the outer peripheral side of the second semiconductor layer, reflecting the tapered form, takes on a form having a gentle end portion with a large curvature. By so doing, it is possible to alleviate an electric field concentration in the end portion of the second semiconductor layer when a reverse bias voltage is applied. As a result of this, it is also possible to easily suppress a reduction in breakdown voltage in only the comparatively shallow second semiconductor layer formed by the transition metal acceptor transition.

It is preferable that the cross-section of the insulating film having the tapered form is of a downward convex toward the one main surface.

That is, it is arranged in such a way that the form of the end portion of the insulating film is not a taper formed of one straight line, but is a curved line of a downward convex, or is a taper with a downward convex formed of two or more straight lines. Herein, a downward convex means a form that has a convex in a perpendicular depth direction from the surface of the second semiconductor layer. As it is important that the end portion of the outer peripheral side of the second semiconductor layer is a taper with a large curvature, it is sufficient to form the end portion of the insulating film in such a way as to have that kind of taper. By giving the end portion of the insulating film the heretofore described kind of downward convex form, the increase in the thickness of the insulating film from the aperture end portion toward the semiconductor substrate outer periphery is gradual compared with a taper formed from one straight line. Because of this, as the concentration of the second semiconductor layer also becomes accordingly less intense, decreasing toward the outer periphery, the curvature of the end portion of the outer peripheral side of the second semiconductor layer increases. As a result of this, it is possible for the breakdown voltage to come nearer the value in the flat p-n junction, and it is possible to lessen the reduction of the breakdown voltage.

It is preferable that the semiconductor device manufacturing method includes a step of introducing phosphorus into the insulating film having the tapered form.

When including phosphorus in the insulating film, the phosphorus becomes a gettering site that traps the transition metal. For this reason, the transition metal can be taken in even when the thickness of the insulating film is reduced.

It is preferable that the step of introducing the point defects into the exposed one main surface is an ion implantation.

With an ion implantation, it is possible to introduce the point defects at an even concentration over the whole of the silicon wafer. In particular, when the ions implanted are of an element that becomes an acceptor in silicon, and that has a small diffusion coefficient, it is possible to increase the concentration of the second semiconductor layer at the interface with the anode, and it is possible to obtain good contact.

It is preferable that the transition metal introduced into the semiconductor substrate is platinum.

Among transition metals, the acceptor transition of platinum is easily advanced by the holes, and the formation of the p-type anode layer is easy. Also, platinum is preferable because, as the level of the platinum recombination centers in silicon is near the conduction band, forming a shallow level, the leakage current decreases.

As heretofore described, according to the invention, it is possible to provide a diode with superior reverse bias characteristics, even in a p-type anode layer formed by the acceptor transition of a transition metal, and it is possible to provide a manufacturing method whereby it is possible to significantly simplify the manufacturing process of the diode.

BRIEF DESCRIPTION OF THE DRAWINGS

The foregoing advantages and features of the invention will become apparent upon reference to the following detailed description and the accompanying drawings, of which:

FIG. 2 is a main portion sectional view of a semiconductor device according to Working Example 1 of the invention;

FIGS. 3A and 3B are main portion sectional views of the semiconductor device according to Working Example 1 of the invention;

FIGS. 23A and 23B are main portion sectional views of a semiconductor device according to Working Example 17 of the invention;

FIGS. 24A and 24B are a main portion sectional view and a sectional schematic diagram of a semiconductor device according to a heretofore known example;

DETAILED DESCRIPTION OF SPECIFIC EMBODIMENTS

Hereafter, a first conductivity type is referred to as an n-type, and a second conductivity type as a p-type, but the invention can also act in the same way when the n-type and p-type are interchanged. Although expressions such as device, element, and chip or semiconductor chip, are also used for a semiconductor device in the specification, they all indicate the same subject. Although the device of the invention is described with a diode as a working example, the device can also be applied to a heretofore known insulated gate transistor (MOSFET), which is a unipolar device, or insulated gate bipolar transistor (IGBT), which is a bipolar device. A silicon wafer in the specification is a silicon substrate before being fragmented into chips. In a semiconductor chip, a region in which an anode is formed, and through which it is possible to cause a current to flow, is called an "active region." A structural portion, which is a region from an end portion of the active region to an end portion of an outer peripheral side of the chip, that alleviates the electric field intensity of a chip surface generated when voltage is applied to the element, is called a "termination structure region." Furthermore, when an expression such as $1.0E12/cm^2$ is used in a description of concentration or the like, this means $1.0 \times 10^{12}/cm^2$. Al+(−) symbol marked to the right of each region (p region and n region) shown in each drawing means that the impurity concentration is relatively higher (lower) than another region.

Basic Structure

Figure 1:
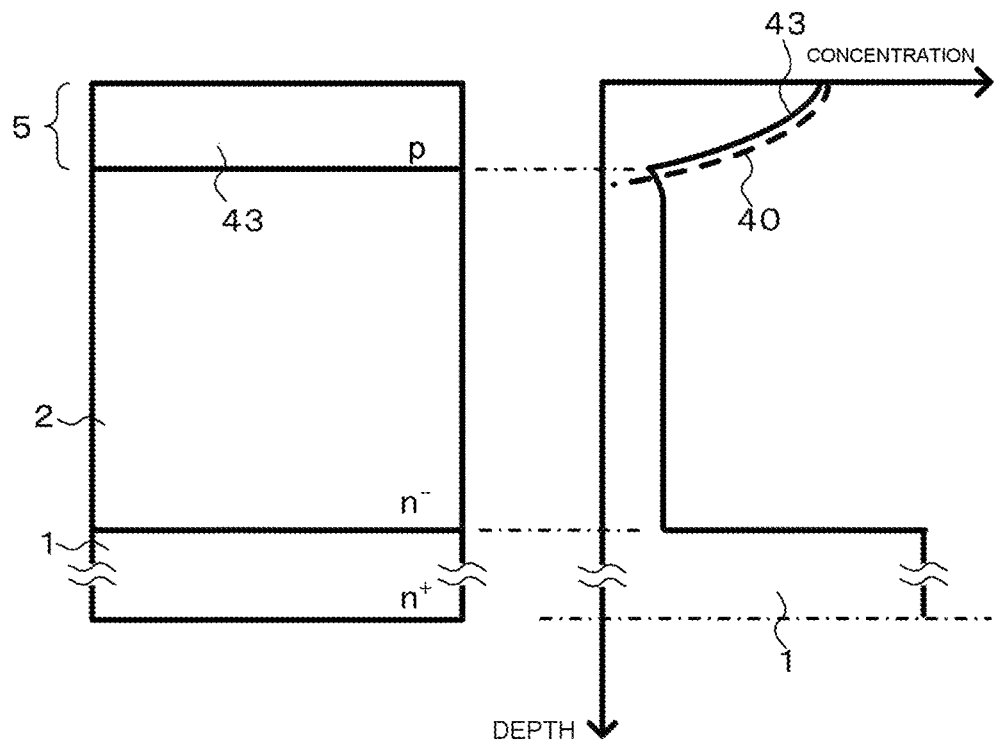
FIGS. 1A and 1B are a main portion sectional view and a sectional concentration distribution diagram of a semiconductor device according to an embodiment of the invention.

A description will be given, using FIGS. 1A and 1B, of the basic structure of the invention. FIGS. 1A and 1B are a main portion sectional view (1A) showing the basic structure of a semiconductor device of the invention, and impurity concentration distribution along a cross-section.

The basic structure of the semiconductor device of the invention is as follows. Inversion advancement region 43 inverted to a p-type by a transition metal becoming an acceptor, and in which the acceptor transition is advanced by point defects to be described hereafter, is formed on one main surface (the upper side in the drawing) of n-type drift layer 2. Inversion advancement region 43 configures p-type anode layer 5 of a diode of the invention, and the transition metal is, for example, platinum or gold, with platinum being particularly good. Point defect layer 40 is introduced into inversion advancement region 43. The concentration distribution of point defect layer 40 is higher than the concentration in a condition of thermal equilibrium. N-type semiconductor substrate 1 with a concentration higher than that of n-type drift layer 2 is adjacent to the other main surface (the lower side in the drawing) of n-type drift layer 2. As will be described hereafter, n-type semiconductor substrate 1 is formed from, for example, a heretofore known CZ wafer formed using the Czochralski method, and antimony or arsenic is introduced to a concentration of more than $1E18/cm^3$ as a donor impurity. Also, n-type drift layer 2 is formed on the surface of n-type semiconductor substrate 1 using, for example, an epitaxial growth method, and the donor impurity is phosphorus.

Herein, a description will be given of, among portions configuring the invention, elements not shown in FIGS. 1A and 1B. An anode is formed on the upper surface of inversion advancement region 43 in such a way as to come into contact with inversion advancement region 43. Meanwhile, a cathode is formed on the lower surface of n-type semiconductor substrate 1 in such a way as to come into contact with n-type semiconductor substrate 1.

Structural Characteristics

Structural characteristics of the invention are as follows.
1. A p-type anode layer includes a transition element which is electrically activated, becoming an acceptor.
2. Point defects of a concentration greater than in a condition of thermal equilibrium are introduced into the p-type anode layer, and the acceptor transition of the transition element is advanced by the point defects.

The second characteristic is particularly important. It is easy for the transition metal to move into excessive point defects, mainly holes, formed on one main surface of the semiconductor substrate, and easy for the transition metal to enter the silicon crystal lattice position. Therefore, the transition metal in the lattice position becomes a donor or an acceptor. In other words, by introducing point defects into, for example, the region forming the p-type anode layer to a concentration in excess of that in a condition of thermal equilibrium, it is possible to advance the acceptor transition of the transition metal. Hereafter, a phenomenon whereby an n-type silicon surface is inverted to a p-layer by the acceptor transition of the transition metal being advanced by the point defects will be called an "inversion advancement effect." That is, by controlling the concentration of the point defects introduced into the silicon, it is possible to control the concentration distribution of the p-type anode layer formed by the acceptor transition of the transition metal in such a way that it is a concentration sufficiently higher than that of the n-type drift layer.

Herein, the diffusion of the transition metal will be simply described. A more detailed description will be given hereafter in the working examples of the manufacturing method. Taking the transition metal as M and the holes as V, the diffusion mechanism of the transition metal is considered to be as follows.

$$M(i)+V \Leftrightarrow M(s) \tag{E1}$$

$$M(i) \Leftrightarrow M(s)+I \tag{E2}$$

Herein, M(i) represents interstitial transition metal atoms, M(s) lattice position transition metal atoms, V holes, and I Si self interstitial atoms. Equation E1 is called a Frank-Turnbull (F-T) mechanism, and Equation E2 a kick-out mechanism. It is supposed that the transition metal M(s) acts as, for example, an acceptor. Meanwhile, M(i) has a large diffusion coefficient in comparison with a normal dopant B or P. For this reason, a state of equilibrium is quickly achieved in the silicon wafer, and the concentration of M(s) is determined by the concentration (distribution) of V or I. Therefore, it is possible to control the M(s) concentration distribution by purposely introducing V, and in particular, by introducing an excess of V, the concentration of the lattice position transition metal atoms also increases by that amount.

Hereafter, a description will be given of a preferable configuration of the basic structure.

The point defects also act as recombination centers that reduce a minority carrier lifetime. In particular, with a diode used in power conversion (a power source circuit, inverter circuit, or the like), it is common to introduce recombination centers (point defects) into the n-type drift layer to a concentration in excess of that in a condition of thermal equilibrium, with the object of shortening reverse recovery time. For this reason, in order to provide an inversion advancement effect in the p-type anode layer, it is necessary to attract the transition metal to the point defects of the p-type anode layer, rather than to the point defects of the n-type drift layer. In order to do this, it is preferable that the concentration of point defects in the region forming the p-type anode layer is higher than the concentration of point defects in the n-type drift layer at the point at which the transition metal is diffused. By so doing, it is possible to bring about the inversion advancement effect concentrated in the p-type anode layer. Meanwhile, as a way of shortening the diode reverse recovery time, there is also a heretofore known method of locally controlling lifetime using a light ion irradiation with He, or the like. In this case, it may happen that, in a region in which point defects of He or the like are localized, the density of the point defects is higher than that of the point defects introduced into the p-type anode layer. When the transition metal is introduced in this condition, the transition metal is more attracted to the region of localized point defects of He or the like than to the p-type anode layer. Therefore, it is preferable that this kind of localized point defect region is introduced after the diffusion of the transition metal is finished. Furthermore, it is also preferable that annealing of the localized point defect region is carried out at a temperature lower than the diffusion temperature (for example, 500° C. or lower).

As the point defects introduced into the p-type anode layer formation region, there are, apart from the previously mentioned holes, multi-holes (also called hole pairs), interstitial silicon, interstitial impurities (interstitial oxygen, or the like), and substitutional impurities (boron, phosphorus, or the like, as a so-called dopant). In order for the transition metal to become an acceptor, it is important for the transition metal to enter the silicon crystal lattice position, as with the previously described mechanism. For this to happen, it is necessary that the lattice position is open, meaning that, of the point defects, holes and multi-holes are preferable. Meanwhile, in a process of introducing interstitial silicon, an interstitial impurity, or a substitutional impurity, and in a process in which they diffuse, holes or multi-holes always exist. Therefore, in order for the previously mentioned mechanism to gain impetus, it is firstly important to introduce, and cause to exist, more excess defect points in the silicon than in a condition of thermal equilibrium. Among these, it is preferable that more holes or multi-holes exist than in a condition of thermal equilibrium.

Herein, a description will be given of the average concentration of point defects in a condition of thermal equilibrium. When a crystal is pulled, or in a step of forming an element, a silicon wafer is heated to a temperature of 1,000° C. or more during the diffusion of a normal dopant (phosphorus, boron, or the like) and the formation of a thermal oxide film. One portion of point defects introduced at this time remains in the silicon when cooling, and the concentration thereof is in the order of approximately 1E3 to 1E7/cm$^3$ in the holes. Therefore, it is sufficient to introduce holes of a concentration higher than this concentration. For example, as the concentration of the p-type anode layer is on the order of 1E15 to 1E18/cm$^3$, it is preferable that the holes are also of a concentration on the same order of 1E15 to 1E18/cm$^3$. Furthermore, the depth of the introduced point defects determines the depth of the p-type anode layer. Therefore, it is good that the depth at which the concentration of the point defects included in the p-type anode layer becomes the concentration of the point defects included in the n-type drift layer exists at least at a depth 0.1 to 5.0 µm from the surface of the anode side, and preferably at a depth of 0.5 to 3.0 µm.

Next, a description will be given of kinds of transition metal that become an acceptor.

Among transition metals, the most preferable is platinum. As is well known, there are a large number of transition metals, but those among them that exhibit acceptor characteristics inside silicon are Pt (platinum), Pd (palladium), Ag (silver), Au (gold), Co (cobalt), V (vanadium), Ni (nickel), Fe (iron), Cr (chromium), Mn (manganese), and the like. Provided that one of these transition metals is used, it is possible to form a p-type anode layer by its becoming an acceptor. Platinum and gold have the highest acceptor transition ratios among the transition metals. For this reason, it is easy for the acceptor transition to be advanced by the holes, and the formation of the p-type anode layer is easy.

The introduction of excess point defects is an essential configuration peculiar to the dopant being a transition metal, and on the contrary, these point defects rather constitute a hindrance to a heretofore known dopant becoming an acceptor or a donor. The level at which heretofore known dopants form in the silicon bandgap is extremely close to a conduction band or valence band, and indicates a shallow level. For this reason, the rate at which the dopants are electrically activated and supply carriers (electrons, holes), that is, the activation ratio, is high at, for example, 50% or more. A dopant whose activation ratio is high in this way is a representative element along with silicon, and the diffusion mechanism thereof is a lattice position substitution type. Therefore, it is preferable that the silicon crystal, which is the host material, is also in a condition with few defects. By so doing, in a condition in which a large number of excessively introduced holes remain, the dopant is prevented from forming covalent bonds with surrounding silicon atoms.

However, the transition metal, the contribution of d-orbital and f-orbital electrons being large, forms a bond different from the bond between two representative elements. For this reason, the level at which the transition metal forms in the silicon bandgap is distanced from a conduction band or valence band, and indicates a deep level. Also, the activation ratio is also low, and it is often the case that the diffusion mechanism is an interstitial diffusion type. Therefore, in order for the transition metal to act as a dopant, it is made to enter the lattice position as much as possible. On top of this, it is necessary to stabilize interatomic bonds by displacing the atoms so as to bond, albeit weakly, with first adjacent and second adjacent silicon atoms of the transition metal that has entered the lattice position, or with a plurality of silicon atoms in a wider range, forming a defect complex. In order to do this, unlike with a normal dopant, it is necessary to introduce a large number of defects, particularly holes. That is, by an excess of holes or multi-holes existing, it is possible for the transition metal to enter the lattice position, and furthermore, bond with a plurality of surrounding silicon atoms, thus forming a defect complex. By so doing, holes or electrons can be supplied at a plurality of levels.

Also, platinum, which indicates a level near a conduction band, is also more preferable as a minority carrier recombination level. As the typical recombination level of platinum is in the order of 0.23 eV from the conduction band, it is a comparatively shallow level. For this reason, leakage current occurring, for example, when a reverse bias voltage is applied is small. From the above perspectives, platinum is the most preferable transition metal when implementing the invention.

Working Example 1

Next, a description will be given, using FIG. 2, of Working Example 1, which is a more preferable embodiment of the invention. FIG. 2 is a main portion sectional view showing Working Example 1 of the invention.

Working Example 1 is a working example of the form of the end portion of the chip outer peripheral side of p-type anode layer 5. The end portion of the chip outer peripheral side is a transition region between active region 19 and termination structure region 20, that is, an end portion of p-type anode layer 5 in active region end portion 18. In active region end portion 18, of curvature radii in a region in which the p-n junction of p-type anode layer 5 gradually decreases from a depth $X_j$ toward the surface of n-type drift layer 2, the longest value of the curvature radii is taken to be $L_j$. In FIG. 2, $L_j$ is the length from the end portion of a portion in which the p-n junction is flat to a place in which the p-n junction intersects with the surface of n-type drift layer 2. It is preferable that the curvature radius $L_j$ is bigger than the diffusion depth $X_j$ of p-type anode layer 5. Furthermore, it is preferable that $L_j$ is more than twice as big as $X_j$. Furthermore, it is preferable that $L_j$ is more than three times as big as $X_j$.

Hereafter, a description will be given, using the drawings, of working effects of Working Example 1. FIGS. 3A and 3B are main portion sectional schematic views for illustrating a working effect of Working Example 1. FIG. 3A is a sectional schematic view of a case in which p-n junction 55 curves in a cylindrical form in aperture end portion 54 of oxide film 15.

For example, a case will be considered where oxide film 15 is patterned in a striped form toward the back of FIG. 3A, boron is ion implanted into the silicon substrate surface with oxide film 15 as a mask, and the boron is thermally diffused. After the boron is thermally diffused, as is well known, p-n junction 55 curves in a cylindrical form in aperture end portion 54 owing to the diffusion in a horizontal direction of the boron. When a reverse bias voltage is applied to p-n junction 55 curved in a cylindrical form in this way, depletion layer 52, reflecting the form of p-n junction 55, curves and spreads to n-type drift layer 2 also. The electric field intensity of depletion layer 52 in the curved portion at this time is greater than in the case of the flat junction.

Therefore, in order to investigate how big the cylindrical radius (that is, the curvature radius) of p-type anode layer 5 needs to be for the electric field intensity to be alleviated to the same extent as in the flat junction, an estimate will be made of how high the electric field intensity becomes in cylindrical depletion layer 52.

Firstly, it is taken that p-type anode layer 5 is distributed in a cylindrical form with a radius $r_j$, as shown in FIG. 3A. That is, p-n junction 55 is of a cylindrical form, and hereafter will be called a cylindrical junction. Also, it is taken that depletion layer 52, which spreads when a reverse bias voltage is applied to p-n junction 55, spreads inside n-type drift layer 2 in a cylindrical form with a radius $r_d$. At this time, $r_d$ is the width of the depletion layer to the end portion of depletion layer 52. Herein, the width of the depletion layer spreading inside the p-type anode layer is sufficiently small that it can be ignored for the sake of convenience. Supposing that the spread of the depletion layer depends only on the radial direction, that is, that it is isotropic, the spatial gradient (divergence) of an electric field intensity E at any depth r of depletion layer 52 conforms to a Poisson equation in a cylindrical coordinate system considering only the radial direction. For this reason, the Poisson equation is as follows.

$$h_{Si}\sqrt{\frac{D_{OX}}{D_{Si}}} \equiv h_{th} \qquad \text{Equation 2}$$

$N_D$ is the donor concentration of the n-type drift layer, q the charge amount, and $\epsilon_s$ the silicon dielectric constant. Furthermore, considering a time when a high voltage is applied and the depletion layer 52 spreads sufficiently widely, it is taken that the relationship of $r_d$ to the depth $r_j$ of the p-n junction is $r_j \ll r_d$. When solving Equation 2 using this approximation condition and a boundary condition whereby the electric field intensity at $r_d$ is zero, the electric field intensity at $r_j$, which is the position of the p-n junction, reaches a maximum electric field intensity, and the value thereof is expressed as in the following equation.

$$L_{Or} \geq \eta \frac{h_{Ox}}{h_{th}} x_l \qquad \text{Equation 3}$$

$E_{Cyl}$ means the electric field intensity in the case of the cylindrical junction. Taking the applied voltage to be a certain value $\phi_0$, $\phi_0$ is proportional to a value wherein the electric field distribution is integrated from the distance $r_j$ to $r_d$, meaning that, when considering that $r_j \ll r_d$, $\phi_0$ becomes, from Equation 3, $$\phi_0 = -\int_{r_l}^{r_d} E(r)dr \cong -\left(\frac{qN_D r_d^2}{2\varepsilon_S}\right)\ln\left(\frac{r_j}{r_d}\right) \qquad \text{Equation 4}$$

Next, the maximum electric field intensity in the flat junction shown in FIG. 3B will be estimated.

In the flat junction, the depletion layer spreads one-dimensionally in the depth direction, meaning that the spatial gradient (divergence) of the electric field intensity E conforms to Equation 5, which is a Poisson equation in a Cartesian coordinate system considering only the depth direction (x direction).

$$\frac{\partial E}{\partial x} = \frac{qN_D}{\varepsilon_S} \qquad \text{Equation 5}$$

Herein, considering a time when a high voltage is applied and depletion layer 52 spreads sufficiently widely, in the same way as in the cylindrical junction, it is taken that the relationship of a depletion layer width $x_d$ to the depth $x_j$ of p-n junction 55 is $x_j \ll x_d$. When solving Equation 5 using this approximation condition and a boundary condition whereby the electric field intensity at $x_d$ is zero, the electric field intensity at $x_j$, which is the position of the p-n junction, reaches a maximum electric field intensity, and can be approximately expressed as in the following equation.

$$E_{PP}(x_j) = \frac{qN_D}{\varepsilon_N}(x_j - x_d) \cong -\frac{qN_D}{\varepsilon_S}x_d \qquad \text{Equation 6}$$

Herein, $E_{pp}$ means the electric field intensity in the case of the flat junction. Taking the applied voltage to be a certain value $\phi_0$, $\phi_0$ is proportional to a value wherein the electric field distribution is integrated from the distance $x_j$ to $x_d$, meaning that, when considering that $x_j \ll x_d$, $\phi_0$ becomes, from Equation 6, $$\phi_0 \cong \frac{qN_D x_d^2}{2\varepsilon_S} \qquad \text{Equation 7}$$

Assuming that Equation 4 and Equation 7 are equivalent when the same voltage $\phi_0$ applied to the cylindrical junction is also applied to the flat junction, $r_d$ and $x_d$ are as in the following equation.

$$x_d = -r_d \ln\left(\frac{r_l}{r_d}\right) \qquad \text{Equation 8}$$

Therefore, a ratio $\beta$ between the maximum electric field intensity in the cylindrical junction and the maximum electric field intensity in the flat junction, substituting Equation 8 for Equation 6, becomes, from Equation 3 and Equation 6, $$\beta \equiv \frac{E_{Cyl}(r_j)}{E_{PP}(x_j)} \cong \left(-\frac{r_d}{2r_j^2}\right) / \ln\left(\frac{r_j}{r_d}\right) \qquad \text{Equation 9}$$

Figure 4:
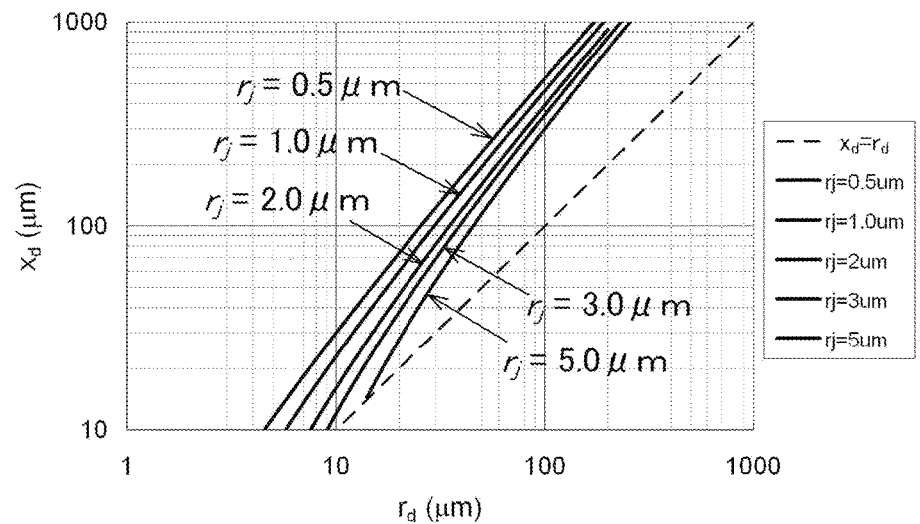
FIGS. 4A to 4C are electrical characteristic diagrams of the semiconductor device according to Working Example 1 of the invention.
Figure 4:
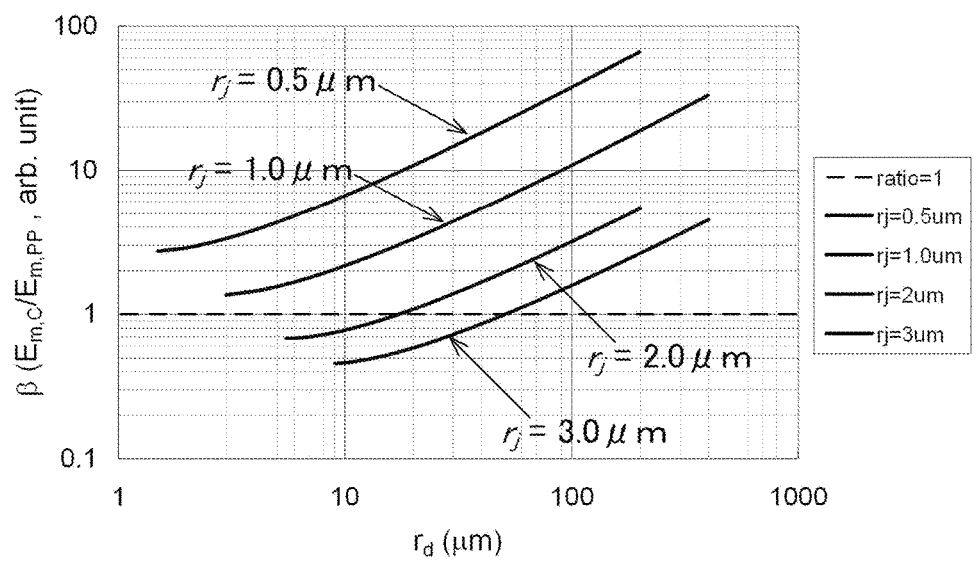
Figure 4:
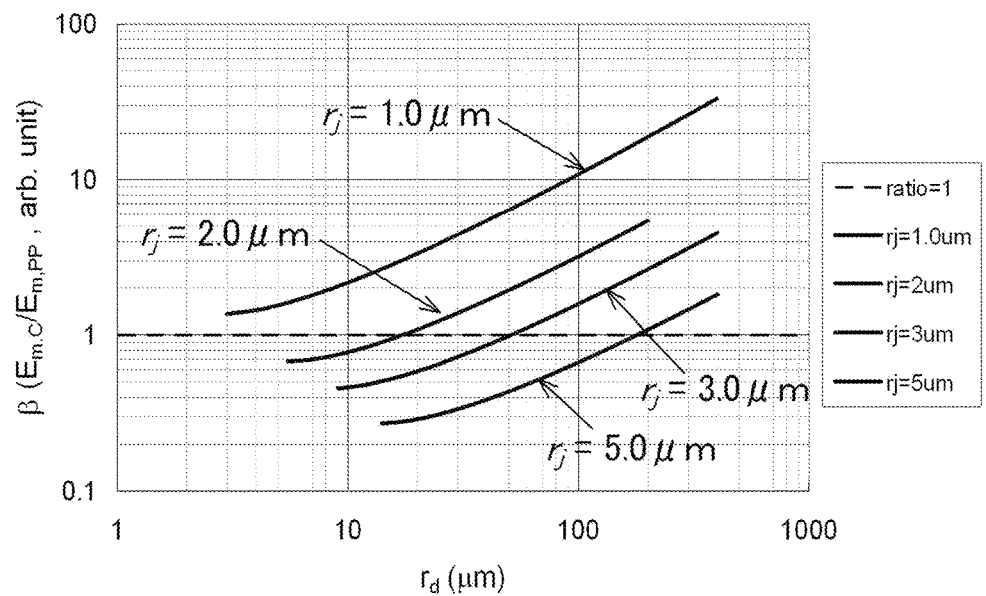

Firstly, the relationship between $r_d$ and $x_d$ when $r_j$ is taken as a parameter in Equation 8 is shown in FIG. 4A. As the depletion layer also spreads in a horizontal direction (a direction horizontal to the surface of n-type drift layer 2) in the cylindrical junction, the amount of space charge that can be supplied from cylindrical p-type anode layer 5 to depletion layer 52 of n-type drift layer 2 in FIG. 3A is less than in the case of the flat junction. Because of this, the depletion layer width $r_d$ of depletion layer 52 of n-type drift layer 2 is smaller than the depletion layer width $x_d$ of the flat junction. According to FIG. 4A, the smaller $r_j$, that is, the smaller the radius of p-n junction 55, the larger the ratio between $x_d$ and $r_d$.

Next, based on the relationship between $x_d$ and $r_d$, an estimate will be made of the value of the ratio $\beta$ (Equation 9) between the maximum electric field intensities in the cylindrical junction and flat junction when the depletion layer spreads by $x_d$ in the flat junction.

Firstly, a case in which a rated voltage is 300 V will be considered. As a diode with this rated voltage, there is a low loss diode (LLD), or the like, used in, for example, a power source circuit. When the voltage applied to the diode is 300 V, the depletion layer width $x_d$ spreading in the flat junction, although also depending on the donor concentration of n-type drift layer 2, is in the order of 30 to 50 μm, and typically in the order of 40 μm. Then, it is taken that the depth $r_j$ (=$x_j$) of the p-type anode layer is 0.5 to 3.0 μm. At this time, the relationship between the electric field intensity ratio $\beta$ and $r_d$ from Equation 9 is as in FIG. 4B. For example, when $x_d$ spreads 40 μm in the flat junction when $r_j$ is 1.0 μm, it is seen from FIG. 4A that $r_d$ in the cylindrical junction is approximately 15 μm. It is seen from FIG. 4B that $\beta$ for the values of $r_j$ and $r_d$ at this time is 2.8. That is, the maximum electric intensity in the cylindrical junction is 2.8 times that in the flat junction. The avalanche breakdown impact ionization rate increases with extreme sensitivity in response to the electric field intensity. For example, when the electric field intensity increases 2.8 times, as previously described, the impact ionization rate increases by 10 times or more. In response to this, it is taken that $r_j$ becomes 2.0 μm. Then, when $x_d$ is 40 μm, $r_d$ in the cylindrical junction becomes, in the same way, approximately 18 μm. At this time, $\beta$ also becomes 1.0, and decreases to a size equivalent to the maximum electric field intensity of the flat junction. Thinking simply, it is sufficient to provide the cylindrical junction in which $r_j$ is 2.0 μm in the end portion of the flat junction in which $x_j$ is 1.0 μm. However, as the diffusion coefficient is unambiguously determined for one transition metal, it is not possible to form a junction of differing depths with the flat junction and end portion cylindrical junction in this way with one diffusion.

Therefore, as shown in FIG. 2, the length $L_j$ of the horizontal diffusion portion, wherein the concentration gradually decreases from the end portion of the p-n junction in a direction parallel to the surface of the silicon substrate, is greater than $X_j$. Because of this, the curvature radius of the p-n junction is effectively larger than $X_j$, meaning that it is equivalent to a structure wherein $r_j$ in the previously described consideration is made larger than $X_j$.

In actual analysis, as the isotropic nature of the depletion layer is destroyed by making the curvature radius variable, elements in an azimuthal direction also have to be considered. However, as only a case in which $L_j$ is greater than $X_j$ is considered, it is a direction in which the electric field intensity is alleviated more than in the heretofore described isotropic consideration, and the estimate of the electric field intensity ratio $\beta$ is sufficiently valid in the isotropic consideration also. In the example in which the rated voltage is 300 V as heretofore described, when $L_j$ is twice $X_j$ (1.0 μm), the maximum electric field intensity ratio $\beta$ is 1.0, the electric field intensity is the same as that in the flat junction, and a reduction in the breakdown voltage is suppressed.

Next, a case in which the rated voltage is 1,200 V will be considered. As a diode with this rated voltage, there is a free wheeling diode (FWD) used together with an inverter, or the like, using, for example, an insulated gate bipolar transistor (IGBT) of the same 1,200 V class. When the voltage applied is 1,200 V, the depletion layer width $x_d$ spreading in the flat junction is in the order of 120 to 250 μm, and typically in the order of 200 μm. Then, the depth $r_j$ (=$x_j$) of the p-type anode layer is typically 1.0 to 5.0 μm. At this time, the relationship between the electric field intensity ratio $\beta$ and $r_d$ from Equation 9 is as in FIG. 4C. Herein, it should be noted that when $r_j$ is the same in FIGS. 4B and 4C, the curve is also the same curve. For example, when $x_d$ spreads 200 μm in the flat junction when $r_j$ is 2.0 μm, it is seen from FIG. 4A that $r_d$ in the cylindrical junction is approximately 59 μm. It is seen from FIG. 4C that $\beta$ at this time is approximately 2.2. That is, the maximum electric intensity in the cylindrical junction is 2.2 times that in the flat junction. In the same way as in the previously described consideration of the 300 V class, when the electric field intensity increases 2.2 times, as previously described, the impact ionization rate increases by 10 times or more. Meanwhile, it is taken that $r_j$ is increased only 1.5 times, from 2.0 μm to 3.0 μm. Then, when $x_d$ is 200 μm, $r_d$ in the cylindrical junction becomes, in the same way, approximately 65 μm. At this time, $\beta$ becomes 1.2 times, and decreases to a value near the maximum electric field intensity of the flat junction. In the example in which the breakdown voltage is 1,200 V too, when $L_j$ is 1.5 times $X_j$ (1.0 μm), the maximum electric field intensity ratio $\beta$ is 1.2, and the electric field intensity is sufficiently near that in the flat junction, meaning that a reduction in the breakdown voltage is suppressed, as expected.

Figure 5:
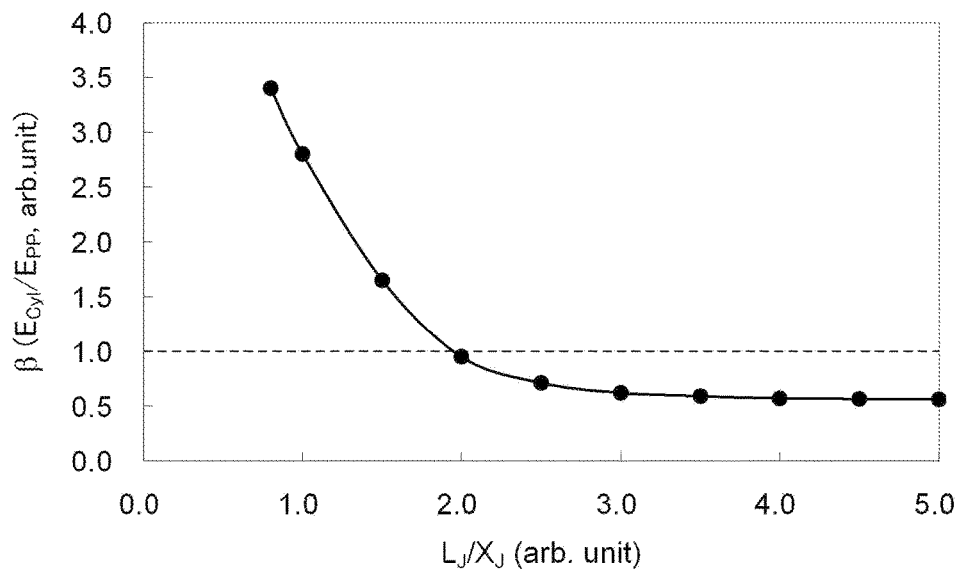
FIG. 5 is an electrical characteristic diagram of the semiconductor device according to Working Example 1 of the invention.

Herein, actually, provided that the depletion layer width $x_d$ in the flat junction and the diffusion depth $r_j$ (=$x_j$) in the p-type anode layer are known, the estimate of $\beta$ can be calculated from Equation 8 and Equation 9. That is, regardless of the rated voltage, the estimate of $\beta$ can be carried out provided that the spreading depletion layer width is determined. Therefore, provided that the ratio between $L_j$ and $x_j$ in the structure of Working Example 1 is determined, it is possible to unambiguously calculate the maximum electric field intensity ratio β between the cylindrical junction and flat junction. That is, it is possible to universally calculate "how big the cylindrical radius (that is, the curvature radius) of p-type anode layer 5 needs to be for the electric field intensity to be alleviated to the same extent as in the flat junction", as mentioned at the beginning of Working Example 1. Therefore, expanding the considerations of the 300 V class and 1,200 V class, results of calculations considering various combinations of $X_j$ (=$r_j$) and the depletion layer width $x_d$ of the flat junction are as in the graph shown in FIG. 5. FIG. 5 is a characteristic diagram showing the dependency of the maximum electric field intensity ratio β between the flat junction and cylindrical junction on the length $L_j$ (that is, the horizontal direction length of the end portion of the p-type anode layer) of active region end portion 18 with respect to the diffusion depth $X_j$ of p-type anode layer 5 of FIG. 2. Firstly, when $L_j$ is the same as $X_j$, β is approximately 2.8. Next, it can be understood from the graph of FIG. 5 that simply by $L_j$ becoming greater than $X_j$, that is, by the ratio between $L_j$ and $X_j$ becoming more than one, an effect is achieved whereby the electric field intensity ratio β decreases sharply by more than three times. That is, it is preferable that the ratio between $L_j$ and $X_j$ is more than one. For example, simply by the ratio between $L_j$ and $X_j$ ($L_j/X_j$) increasing 20% from 1.0 to 1.2, β decreases to approximately 2.3. As the impact ionization rate is a linear function of the impact ionization coefficient, the impact ionization rate also, naturally, depends with extreme sensitivity on the electric field intensity. As the impact ionization rate decreases to approximately one-third when β decreases from 2.8 to 2.3, as heretofore described, the level of avalanche breakdown occurrence is sufficiently suppressed by this alone. Furthermore, when the ratio between $L_j$ and $X_j$ is 1.5, β decreases to approximately 1.6, and the impact ionization rate decreases to approximately one-tenth, meaning that avalanche breakdown is further suppressed. Then, it is seen that when the ratio between $L_j$ and $X_j$ is 2 or more, the electric field ratio β goes under 1. That is, when the ratio between $L_j$ and $X_j$ is 2 or more, avalanche breakdown occurs in the flat junction rather than in the cylindrical junction, meaning that the breakdown voltage of the whole element can be determined in the flat junction. Therefore, it is more preferable that the ratio between $L_j$ and $X_j$ is 2 or more. Furthermore, as β stabilizes in the region of 0.6 when the ratio between $L_j$ and $X_j$ is 3 or more, this is still more preferable, as the actual electric field intensity is stably the same as in the flat junction.

Meanwhile, in an actual element, it is often the case that the p-type anode layer is formed in a rectangular form on the chip surface, in which case the maximum electric field intensity is in angled portions in the four corners rather than on the edge of one linear side, and the p-n junction also is a curve on a sphere rather than cylindrical (hereafter called simply a spherical junction). For this reason, as the maximum electric field intensity also increases further, it is also necessary to consider the advantage of the spherical junction to the maximum electric field intensity 13 with respect to the ratio between $L_j$ and $X_j$. As a Jacobian when converting coordinates from Cartesian coordinates to cylindrical coordinates in two dimensions is 1/r, and $1/(r^2 \sin θ)$ in the case of three-dimensional polar coordinates, it is $1/r^2$ when isotropic and taking sine to be 1. As the Jacobian is a coefficient of the divergence of an electric field vector in a Poisson equation, when calculating the electric field intensity by integrating the Poisson equation, the coefficient owing to the coordinate conversion becomes $r^3$ of the polar coordinates from $r^2$ of the cylindrical coordinates. That is, to give a rough explanation, it can be supposed that the ratio of the two-dimensional maximum electric field intensity in the cylindrical junction is further multiplied to the power of 3/2 (=1.5) in the spherical junction. Consequently, when the maximum electric field intensity in the cylindrical junction is, for example, three times that in the flat junction, the maximum electric field intensity in the spherical junction is $3^{1.5}$ times, that is, approximately 5.2 times that in the flat junction. Therefore, β becomes 1 or less with respect to the ratio between $L_j$ and $X_j$ at $2^{1.5}$, that is, approximately 2.8 times. Therefore, even considering the advantage of the spherical junction, it is still more preferable that the ratio between $L_j$ and $X_j$ is 3 or more. Of course, with the spherical junction advantage too, it is clear that it is possible to suppress a reduction in breakdown voltage when the ratio between $L_j$ and $X_j$ is more than 1, and in particular when it is 2 or more.

Herein, when considering the heretofore described basic configuration of the invention, a p-type anode layer having a transition metal that has become an acceptor is formed in the invention. The p-type anode layer having a transition metal that has become an acceptor has a small diffusion depth ($X_j$), in the order of 0.5 to 3 μm, compared with a normal p-type anode layer formed from boron. For this reason, the form of the p-n junction end portion in which $L_j$ is at least greater than $X_j$, as heretofore described, is essentially an indispensable configuration in the diode of the invention including the p-type anode layer having a transition metal that has become an acceptor. Also, that the maximum electric field intensity of the curved cylindrical junction or spherical junction becomes the same value as, or less than, that in the flat junction by making $L_j$ at least two times greater than $X_j$ has been discovered first in the invention, and is an advantage that could not be foreseen from the related art.

Working Example 2

Next, a description will be given, using FIGS. 6A and 6B, of Working Example 2 of the invention.

Figure 6:
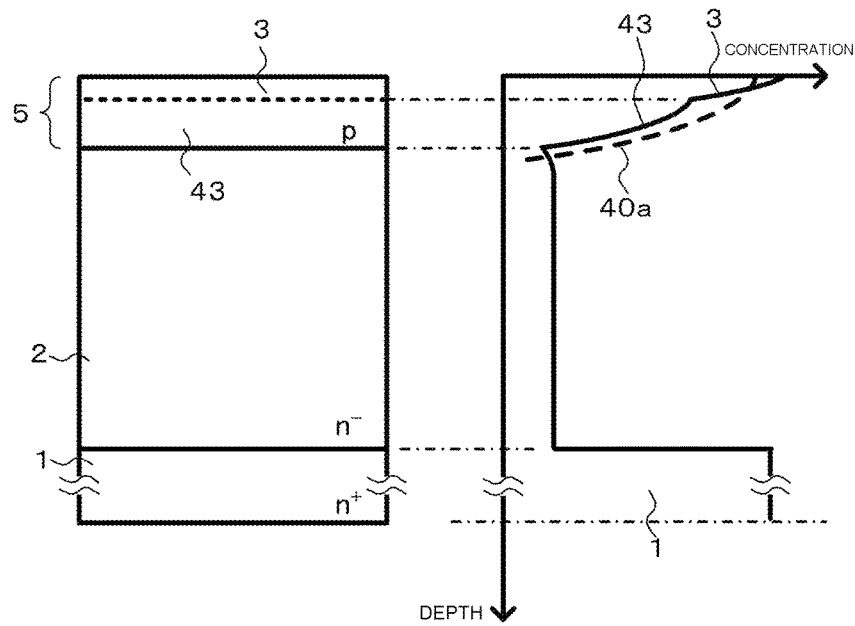
FIGS. 6A and 6B are a main portion sectional view and a sectional concentration distribution diagram of a semiconductor device according to Working Example 2 of the invention.

FIGS. 6A and 6B are a main portion sectional view and sectional schematic view showing Working Example 2 of the invention. A difference in Working Example 2 compared with the basic configuration of the invention shown in FIGS. 1A and 1B is that p-type region 3 of a concentration higher than the doping concentration of inversion advancement region 43 is formed on the upper surface of inversion advancement region 43, and p-type region 3 also forms a surface layer of p-type anode layer 5. Also, a representative element that becomes an acceptor in silicon, for example, a representative element such as B (boron), Al (aluminum), Ga (gallium), or In (indium), being introduced, and point defect layer 40a being formed from the representative element, is also a characteristic of p-type region 3.

When these elements are introduced, point defects, particularly holes and multi-holes, occur. Then, the elements themselves become acceptors in silicon. For this reason, the elements are such that, while forming point defects, the concentration of p-type anode layer 5 increases, particularly on a semiconductor base surface, contact with electrodes has a low resistance, and electrical characteristics such as forward voltage are stable.

Also, as will be described hereafter, the representative element is introduced basically as point defects. For example, by making a heat record after the representative element is introduced by ion implantation at a temperature of 1,000° C. or less, and the time for which the temperature is maintained ten minutes or more, two hours or less, and preferably one hour or less, it is arranged so that, as far as possible, the point defects are not restored to the crystal lattice. That is, a recombination center concentration also becomes higher than the thermal equilibrium concentration because of the point defects introduced. Because of this, lifetime is short in a region in which the concentration of the elements is high, and an introduction of minority carriers (holes in this case) into n-type drift layer 2 is suppressed. As a result of this, despite the concentration of p-type anode layer 5 increasing by the acceptor transition of the transition metal being advanced by the point defects, and inversion advancement region 43 being formed, the reverse recovery current of the diode is also reduced, and it becomes a soft recovery diode.

Furthermore, applying Working Example 2, a description will be given of a structure in which is formed a guard ring layer or a channel stopper region of the termination structure region.

Figure 7:
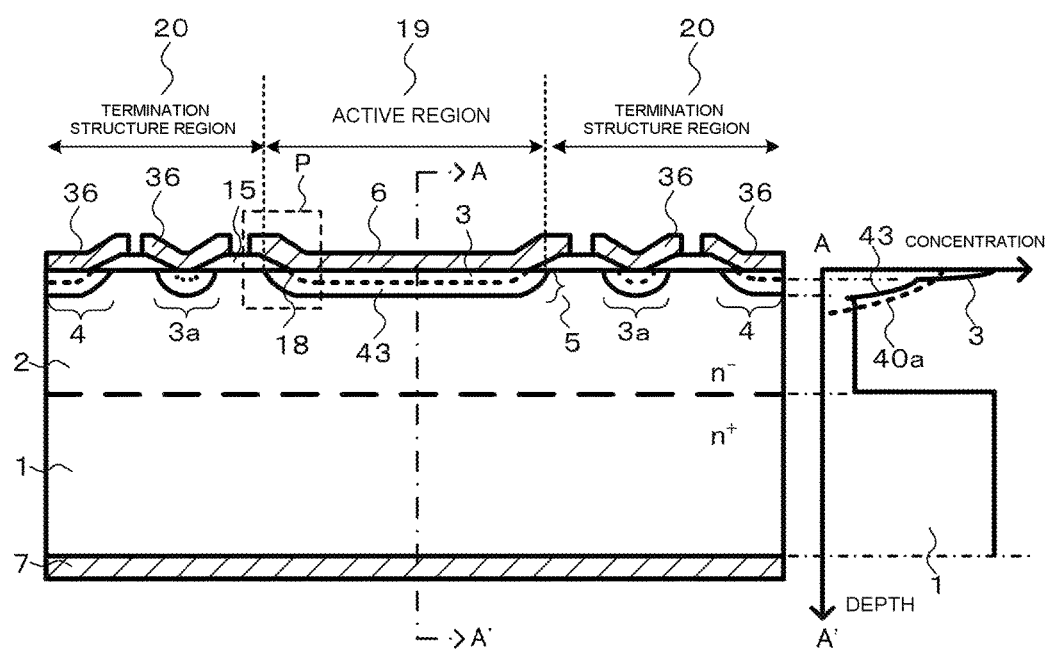
FIGS. 7A and 7B are a main portion sectional view and a sectional concentration distribution diagram of the semiconductor device according to Working Example 2 of the invention.

FIG. 7A is a main portion sectional view of a semiconductor device according to Working Example 2 of the invention. FIG. 7B is a diagram of a doping concentration distribution along a cross-section A-A' of a central portion of FIG. 7A. A flat junction portion of active region 19, that is, a portion in which the p-n junction is parallel to the surface of n-type drift layer 2, and also uniform, has the same configuration as in FIGS. 6A and 6B. Then, regarding active region end portion 18, it is taken that a region P surrounded by broken lines in FIG. 7A has a configuration in the preferable range described in Working Example 1. P-type anode layer 5 of active region 19 includes inversion advancement region 43, in which the acceptor transition is advanced by point defect layer 40a formed by the representative element, and p-type region 3. Then, p-type anode layer 5 is in contact with anode 6. Furthermore, p-type guard ring region 3a and channel stopper region 4 in termination structure region 20 also include the same configuration as p-type anode layer 5. P-type guard ring region 3a and channel stopper region 4 are in contact with field plate 36. The end portion of the chip outer peripheral side or inner peripheral side of p-type guard ring region 3a and channel stopper region 4 include the preferable configuration indicated in Working Example 1, which point is the same as the region P of p-type anode layer 5. In FIG. 7A, there is one p-type guard ring region 3a per termination structure region 20, but there is no objection to there being two or more, according to the rated voltage. Also, when the rated voltage is low (for example, 100 V), the p-type guard ring region may be omitted, and only the channel stopper region 4 provided in termination structure region 20.

Next, a description will be given of a specific configuration of Working Example 2 shown in FIG. 7A.

The n-type semiconductor substrate 1 is an As doped substrate, and the n-type drift layer 2 is a phosphorus doped epitaxial growth layer. For example, the thickness of the n-type semiconductor substrate 1 is 500 μm, and the impurity concentration thereof is $2E19/cm^3$. Also, for example, the thickness of n-type drift layer 2 is 8 μm, and the impurity concentration thereof is $2E15/cm^3$. One portion of the surface of n-type drift layer 2 is covered with oxide film 15, and the end portion of the chip outer peripheral side or inner peripheral side of oxide film 15 is a forward taper. P-type anode layer 5, p-type guard ring region 3a, and channel stopper region 4 all include inversion advancement region 43 in which the acceptor transition of the transition metal is advanced by point defect layer 40a formed by the representative element. Furthermore, p-type region 3 with a concentration higher than that of inversion advancement region 43 is in contact with the upper surface of inversion advancement region 43. Inversion advancement region 43 includes a transition metal that has become an acceptor, with platinum being used here. Inversion advancement region 43 is formed in a portion below a region on the surface of n-type drift layer 2 in which oxide film 15 opens, and onto the tapered portion of the end portion of oxide film 15. The junction depth of inversion advancement region 43 is, for example, 0.5 to 3 μm. Inversion advancement region 43 is formed by n-type drift layer 2 inverting to a p-type owing to the high concentration transition metal piled up in a region in the vicinity of the surface of n-type drift layer 2 becoming an acceptor. The depth of inversion advancement region 43 changes in accordance with the depth of point defect layer 40a formed by the representative element introduced by ion implantation, or the like, into n-type drift layer 2, heat diffusion conditions of the transition metal, and subsequent heat treatment conditions. Also, the concentration distribution of the end portion of the p-n junction portion can be controlled by the oxide film taper form and oxide film phosphorus concentration. Rear surface cathode 7 is formed in such a way as to come into contact with the rear surface of n-type semiconductor substrate 1. Also, channel stopper region 4 may also be an n-type channel stopper region formed by the diffusion of an n-type dopant.

When a reverse bias voltage is applied, the electric field intensity increases in the end portion of the chip inner peripheral side and outer peripheral side of p-type guard ring region 3a too. The increase in the electric field intensity is for the same reason as in active region end portion 18 of p-type anode layer 5, and is an effect of the cylindrical junction or spherical junction. Therefore, it is of course preferable that the form of the end portion of the chip outer peripheral side and inner peripheral side of p-type guard ring region 3a, in the same way as that of p-type anode layer 5, satisfies the configuration in Working Example 1. Also, as it is possible to form p-type guard ring region 3a of Working Example 2 with the same step as p-type anode layer 5, as will be described hereafter, no separate step, such as the related art shown in FIGS. 24A and 24B, for forming p-type guard ring region 3a is necessary, and it is possible to considerably reduce the manufacturing cost. It is also possible to form channel stopper region 4 in the same way as p-type guard ring region 3a, achieving the heretofore described advantage.

Working Example 3

Next, a description will be given, using FIGS. 8A and 8B, of Working Example 3 of the invention.

Figure 8:
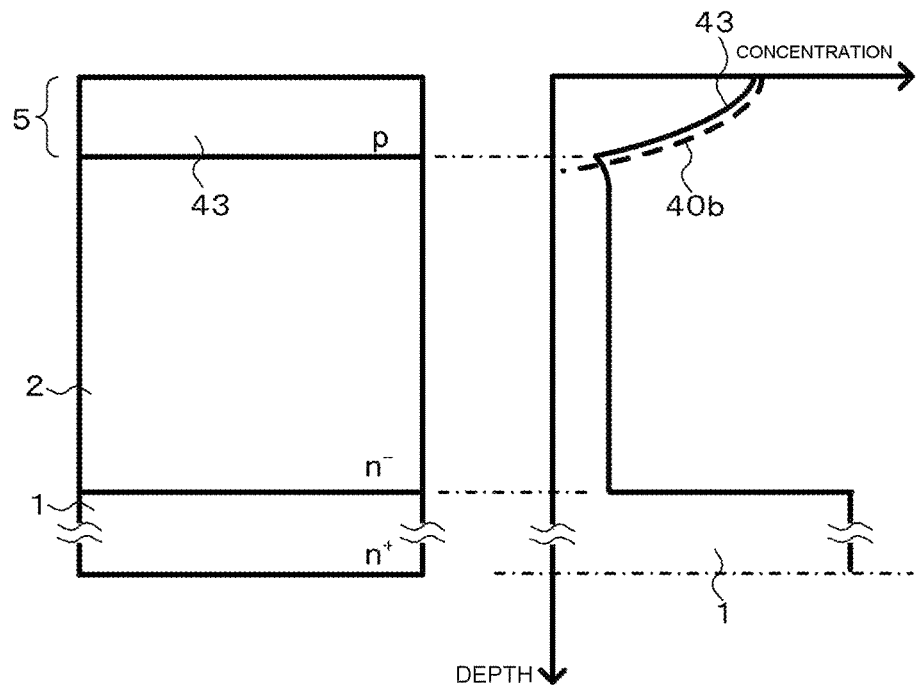
FIGS. 8A and 8B are a main portion sectional view and a sectional concentration distribution diagram of a semiconductor device according to Working Example 3 of the invention.

FIGS. 8A and 8B are a main portion sectional view and sectional schematic view showing Working Example 3 of the invention. A characteristic of Working Example 3 is that the point defect layer introduced in order to advance the acceptor transition of the transition metal in the basic configuration of the invention shown in FIGS. 1A and 1B includes a noble gas element. That is, the point defect layer is point defect layer 40b formed from a noble gas element. The noble gas element is any one of He (helium), Ne (neon), Ar (argon), Kr (krypton), Xe (xenon), or Rn (radon). Alternatively, a combination of these may be implanted.

In the case of Working Example 2, the presence of p-type region 3 shown in FIGS. 6A and 6B means that, when the crystallinity of point defect layer 40a formed from the representative element is restored to a certain extent, the implantation efficiency of the minority carriers (holes) may also increase. In particular, when wishing to suppress the implantation of holes from p-type region 3 as much as possible, it is preferable that the substance introduced as point defects is an element that does not become an acceptor in silicon. Therefore, by introducing the point defects by ion implanting a noble gas element as in Working Example 3, it is possible to suppress an unnecessary acceptor transition, and it is also possible to introduce point defects based on holes, meaning that it is possible to advance the acceptor transition of the transition metal.

Working Example 4

Next, a description will be given, using FIGS. 9A and 9B, of Working Example 4 of the invention.

Figure 9:
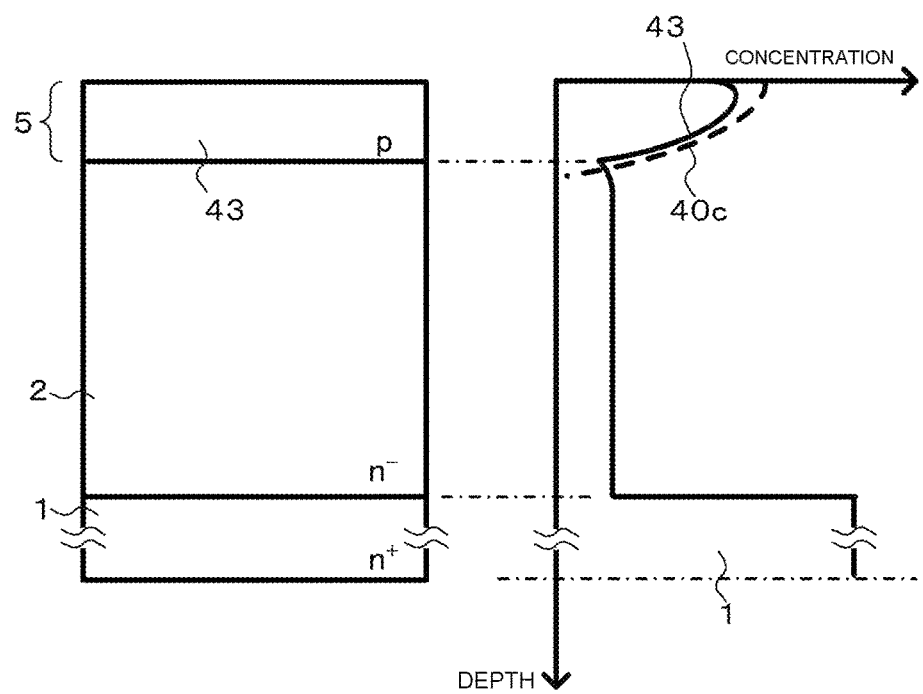
FIGS. 9A and 9B are a main portion sectional view and a sectional concentration distribution diagram of a semiconductor device according to Working Example 4 of the invention.

FIGS. 9A and 9B are a main portion sectional view and sectional schematic view showing Working Example 4 of the invention. A characteristic of Working Example 4 is that the point defect layer introduced in order to advance the acceptor transition of the transition metal in the basic configuration of the invention shown in FIGS. 1A and 1B includes an element that becomes a donor in silicon. That is, the point defect layer is point defect layer 40c formed from a donor element. As an element that becomes a donor, there is P, As, selenium (Se), sulfur (S), hydrogen (H), oxygen (O), lithium (Li), and the like. In principle, an element other than those mentioned may also be used, provided that it is an element that becomes a donor.

As previously described, in the case of Working Example 2, the presence of p-type region 3 shown in FIGS. 6A and 6B means that, when the crystallinity of point defect layer 40a formed from the representative element is restored to a certain extent, the implantation efficiency of the minority carriers may also increase. In particular, when wishing to suppress the implantation from p-type region 3 as much as possible, an element that does not become an acceptor in silicon is preferable. Therefore, by introducing an element that becomes a donor in silicon by ion implantation, it is possible to introduce point defects based on holes, meaning that it is possible to advance the acceptor transition of the transition metal in a portion near the p-n junction of p-type anode layer 5. Furthermore, as the element is a donor element, the donor concentration in the vicinity of the silicon wafer surface increases, the concentration of inversion advancement region 43 is slightly compensated, and the net doping concentration decreases, as in FIG. 9B. Because of this, as it is also possible to suppress the implantation of minority carriers, it is also possible to further increase the soft recovery advantage. That is, despite the fact that inversion advancement region 43 is formed of donor element point defects and a region in which the concentration of p-type anode layer 5 increases is formed, the concentration of the surface layer of p-type anode layer 5 decreases, the implantation efficiency is reduced, and the diode becomes a soft recovery diode.

Working Example 5

Next, as Working Example 5, a description will be given of a manufacturing method for manufacturing the diode of Working Example 2.

FIGS. 10A to 10E are a flow diagram of main portion sectional portions in representative steps of manufacturing Working Example 2 of the invention. The rated voltage is taken to be 200 V. Hereafter, a description is given with platinum as the transition metal, but of course, manufacture is possible in the same way using another heretofore mentioned transition metal too.

FIG. 10A

Figure 10:
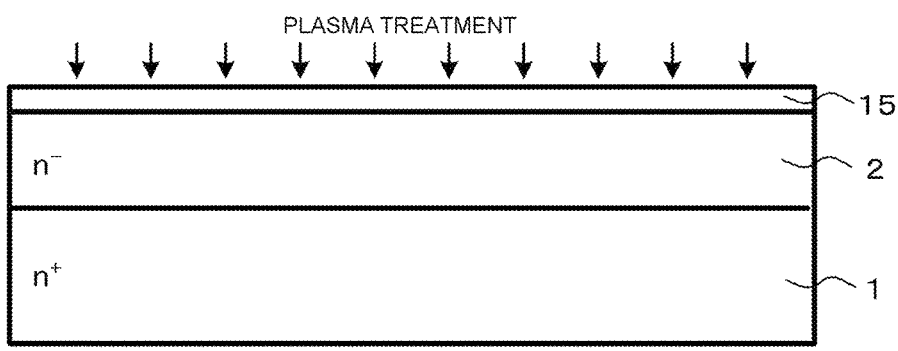
FIGS. 10A to 10E are main portion sectional views showing manufacturing steps of a semiconductor device according to Working Example 5 of the invention.
Figure 10:
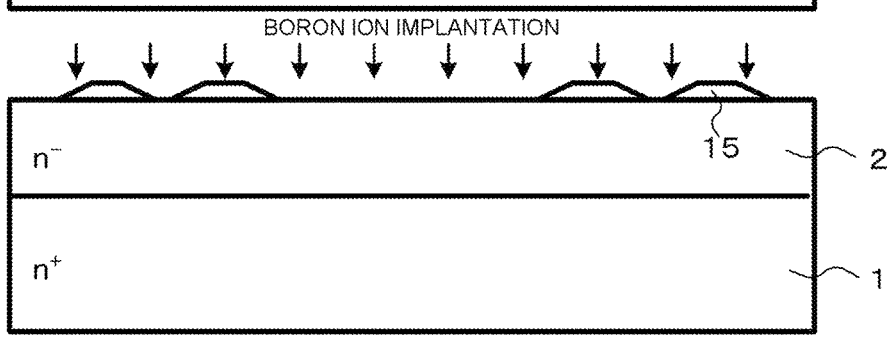
Figure 10:
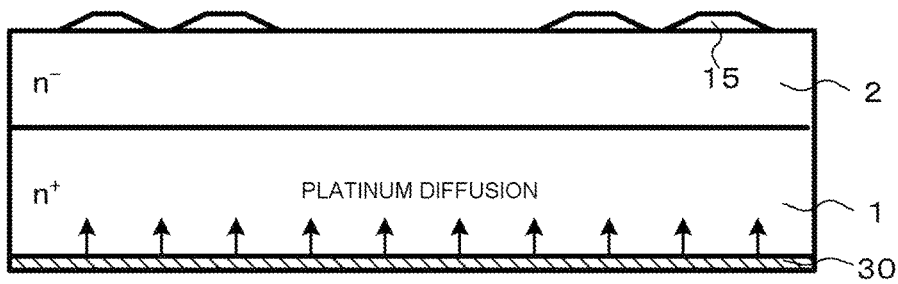
Figure 10:
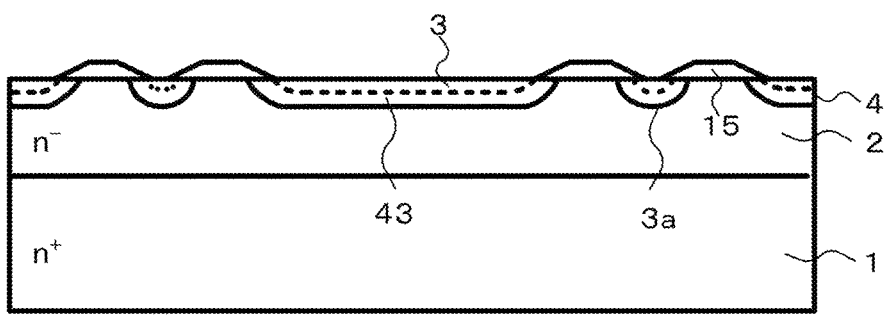
Figure 10:
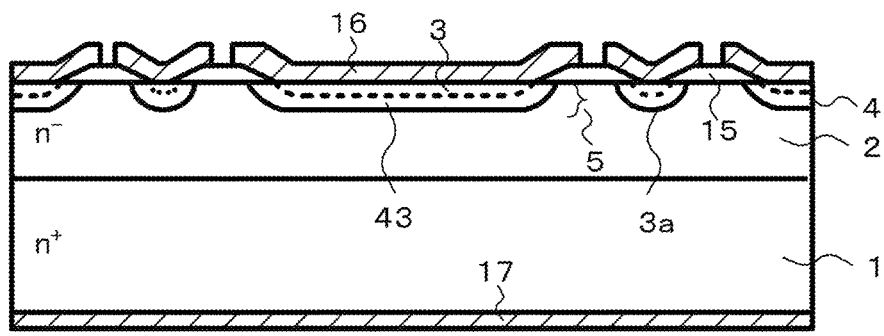

Firstly, n-type drift layer 2 is epitaxially grown to a thickness of 20 μm, with a resistivity of 10 Ωcm, on the upper surface of the low resistance n-type semiconductor substrate 1 including arsenic (As). Continuing, oxide film 15 with a thickness of, for example, 900 nm is formed by thermal oxidation on the surface of n-type drift layer 2. Next, phosphorus glass is formed on the oxide film surface by carrying out processing for several hours at around 1,000° C. in $POCl_3$ gas. Next, a plasma treatment is carried out on the oxide film surface for 20 seconds in plasma of a $CF_4+CCl_4$ mixed gas with a power of 300 W. A condition in which the steps so far are finished is shown in FIG. 10A.

FIG. 10B

Then, of the 0.95 μm thickness of the oxide film (the total thickness of the thermal oxide film and phosphorus glass), a portion of the oxide film corresponding to a region in which the active region is formed is removed using a photolithography technique and etching. Owing to the etching, a horizontal direction length $L_{OT}$ of the tapered portion of the oxide film aperture portion in the active region end portion becomes 4.7 μm. The $L_{OT}$ has a length 4.9 times greater than the oxide film thickness. Continuing, B (boron) is ion implanted into n-type drift layer 2, with the remaining portion of oxide film 15 as a mask. The dose at this time is $5E15/cm^2$, and the accelerating voltage is 50 kV. A condition in which the steps so far are finished is shown in FIG. 10B.

FIG. 10C

Furthermore, a silica paste including 1% platinum by weight is applied to the lower surface of n-type semiconductor substrate 1 or the upper surface of n-type drift layer 2 of the region forming the active region, and heat processing is carried out at 930° C. for one hour. A condition in which the steps so far are finished is shown in FIG. 10C.

FIG. 10D

Subsequently, the applied silica paste is removed with hydrochloric acid. By so doing, the surface vicinity of the active region of n-type drift layer 2 and the surface vicinity of the termination structure region are inverted to p-type, and inversion advancement region 43 is formed. Also, Pt is also segregated to a high concentration in the lower surface layer of n-type semiconductor substrate 1 but, as the n-type dopant concentration is high in the n-type semiconductor substrate 1, no inversion to a p-layer occurs because of the Pt. A condition in which the steps so far are finished is shown in FIG. 10D.

FIG. 10E

Continuing, for example, an Al—Si alloy is deposited by sputtering to a thickness of 5 μm on the wafer surface. Then, the Al—Si alloy is patterned to a desired form using a photolithography technique and etching. Subsequently, heat processing is carried out at 500° C. for one hour under an $N_2$ atmosphere, and a low resistance anode 16 that comes into contact with p-type region 3 is formed. Anode 16 may also be formed by a vacuum deposition of pure Al. Finally, cathode 17 is formed on the rear surface of n-type semiconductor substrate 1 by depositing titanium (Ti), Ni, and Au using a vacuum deposition or sputtering. For example, the thickness of Ti is 0.7 μm, the thickness of Ni is 0.3 μm, and the thickness of Au is 0.1 μm. A condition in which the steps so far are finished is shown in FIG. 10E.

In Working Example 5, anode 16 and cathode 17 are formed after the heat diffusion of the platinum, but this order is not limiting. For example, after the heat diffusion of the platinum, the rear surface of the n-type semiconductor substrate 1 may be ground by backgrinding, so that the thickness of the whole of the semiconductor device is in the order of 300 μm, before the formation of the anode 16 and cathode 17. By so doing, the volume of silicon decreases, and heat release characteristics improve.

Next, a description will be given of operational advantages of the manufacturing method according to Working Example 5.

Firstly, a description will be given of a formation of a p-type inversion layer of n-type silicon by Pt. Pt is diffused from at least one surface of the n-type silicon. The Pt diffuses among the silicon lattices, diffuses through the whole of the silicon wafer in a short time at a diffusion temperature of in the order of 800 to 1,000° C., and reaches a state of equilibrium. The interstitial Pt atoms stabilize when they are disposed in the silicon lattice position via the holes in the silicon crystal. Furthermore, it is supposed that the Pt in the lattice position forms an acceptor level. As previously described, a specific platinum diffusion mechanism is considered to be as follows.

$$Pt(i) + V \Leftrightarrow Pt(s) \tag{E3}$$

$$Pt(i) \Leftrightarrow Pt(s) + I \tag{E4}$$

Herein, Pt(i) represents interstitial Pt atoms, Pt(s) lattice position Pt atoms, V holes, and I Si self interstitial atoms (the operation of E1 is called a Frank-Turnbull (F-T) mechanism, and the operation of E2 a kick-out mechanism). It is supposed that the Pt(s) acts as an acceptor. Meanwhile, Pt(i) has a high diffusion speed in comparison with a normal dopant B or P, quickly reaching equilibrium in the wafer, and the concentration of Pt(s) is determined by the concentration (distribution) of V or I. Therefore, it is possible to control the Pt(s) concentration distribution by purposely introducing V. That is, the Pt moves into the point defects of the silicon, bonding with the point defects, and the Pt becomes an acceptor by being disposed in the lattice position. By the concentration of the point defects increasing, the concentration of the Pt that becomes an acceptor also increases. As a result of this, the inventor presumes that it is possible to form a high concentration, stable p-type inversion layer. Also, as the p-n junction is formed by a compensation with the n-type impurity in the silicon, it is necessary that the silicon hole distribution has a peak in the vicinity of the surface, and is of a low concentration inside the wafer. As the hole density is generally high at the surface of the silicon wafer, the Pt density in the lattice position has a U-shaped distribution which is high near the surface, because of which, it is supposed that the Pt acceptor concentration also has the same kind of U-shaped distribution. With regard to the behavior of the Pt in the silicon, it is known that a deep level 0.23 eV from a conduction band formed by the PT diffusion in the n-type silicon works as an acceptor, and the density of this level has a U-shaped distribution.

Next, a description will be given of the formation of the point defects and introduction methods thereof. By introducing the point defects, there are formed holes and the like, which are indispensable for the acceptor transition of the transition metal and the advantage of the advancement thereof.

As a first method of introducing the point defects, an ion implantation method is proposed as a way of forming point defects which, the density at the silicon surface being high, is compatible with a silicon wafer processing. When accelerated ions enter from the silicon surface by ion implantation, the ions lose their energy while repeatedly colliding with atoms or electron clouds, and finally stop inside the silicon. The distance thereof is a parameter called a range Rp. In the ion acceleration process, the generation of point defects accompanying the movement of silicon atoms is carried out by collision with nuclei. The process of colliding with the atoms is such that the point defect formation distribution condition differs in accordance with the weight, size, and kinetic energy of the implanted ions. Also, with each ion type, when the amount of ions implanted per unit of area increases, the point defect density increases. Normally, in n-type silicon, a B or Al ion implantation is used for the formation of an acceptor, and As or P for the formation of a donor, but either is acceptable for the point defect formation application in the invention. However, it goes without saying that B or Al, which are p-type impurities, are more effective in inverting the n-type silicon to a p-type. Also, when using the ion implantation method, it is easily possible, owing to the difference between the oxide film and the silicon range, to introduce the point defects only in the exposed silicon surface, with the thick oxide film as a mask.

As a second method of introducing the point defects, a silicon surface treatment with plasma can be considered. For example, when carrying out treatment for a long time with the previously mentioned kind of $CF_4 + CCl_4$ mixed gas at a few hundred watts or more, the point defect density near the silicon substrate surface increases. With the second method, although not having the controllability in the depth direction of the ion implantation method, introduction of the point defects is easily possible.

As a third method of introducing the point defects, an ion implantation of a noble gas such as helium, or an irradiation with electron beams, can be considered. By adjusting the accelerating voltage or using a moderating material such as an aluminum plate, it is possible to increase the point defect concentration near the surface by controlling the depth direction distribution of the point defect density, and it is possible to control the point defect density with the number of irradiations.

As a fourth method of introducing the point defects, there is also a method such as a sandblasting method, whereby the point defect density near the surface is increased by colliding fine particles with the silicon surface.

As a fifth method of introducing the point defects, there is an increasing of the point defect density at the surface with a high temperature heat treatment. In order to maintain surface resistance, an annealing under a dopant atmosphere (for example, a phosphorus atmosphere) is desirable to prevent dopant atoms detaching from the silicon surface at high temperature.

As heretofore described, there are various preferable methods of introducing the point defects.

Next, a description will be given of a method of introducing a selective transition metal into the oxide film aperture portion, and a method of forming a selective p-type inversion advancement region using the transition metal.

Figure 11:
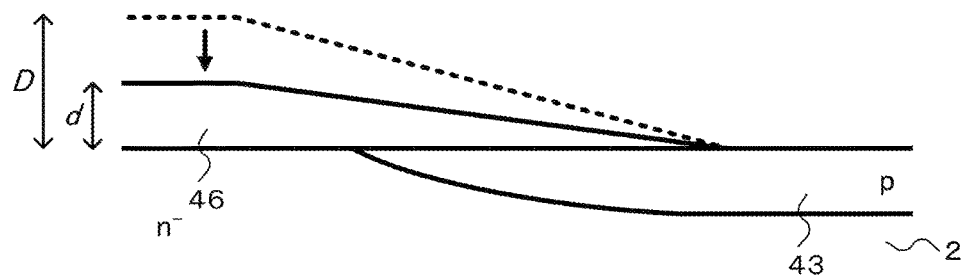
FIG. 11 is a main portion sectional view of a semiconductor device according to Working Example E of the invention.

After forming the oxide film, the oxide film is opened, and the silicon surface is exposed in the oxide film aperture portion, after which, on diffusing the transition metal over the whole of the silicon surface, the transition metal is segregated in the area of the exposed portion of the silicon surface. Meanwhile, as the atoms of the transition metal below the oxide film are taken inside the $SiO_2$ through the Si—$SiO_2$ interface, the silicon layer below the oxide film is not inverted to a p-type. Therefore, in order to selectively form a p-n junction formed by the acceptor transition of the transition metal on the silicon surface, the taking of Pt into the oxide film is utilized. At this time, in order that the p-n junction formed by the acceptor transition of the transition metal is formed as in Working Example 1, the end portion of the oxide film aperture portion is formed after controlling the form thereof to the desired form, after which the transition metal is diffused inside the silicon. By so doing, it is possible to control the distribution form of the end portion of the p-n junction formed by the acceptor transition of the transition metal. The transition metal may be diffused from either the front or rear silicon surface. This is because the diffusion coefficient of the transition metal in silicon is a few digits to ten digits or more larger than that of a representative element such as boron. For this reason, whether introducing from the front surface or rear surface, the transition metal in the silicon near the interface between the silicon and silicon oxide film is taken into the silicon oxide film, and does not escape into the silicon. Furthermore, a structure whereby the oxide film surface is doped with a high concentration of phosphorus, such as by forming a phosphorus glass (PSG) layer on the oxide film, promotes the taking of the transition metal into the oxide film, and is effective in the formation of the p-type inversion advancement region. This is known as the gettering effect of the phosphorus glass layer on the transition metal. When using the phosphorus glass, taking a necessary thickness of the oxide film not including phosphorus to be D, the phosphorus glass can take in platinum to a smaller thickness d, as shown in, for example, FIG. 11.

Working Example 6

Next, as Working Example 6, a description will be given of other introduction methods whereby the point defects are introduced into the silicon surface (that is, the surface of the n-type drift layer).

Figure 12:
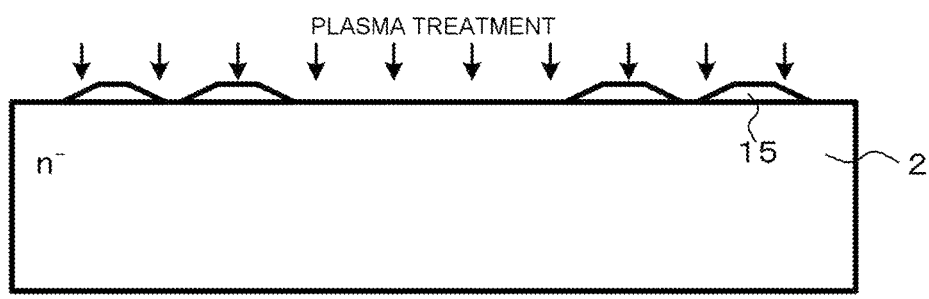
FIGS. 12A to 12C are main portion sectional views showing manufacturing steps of a semiconductor device according to Working Example 6 of the invention.
Figure 12:
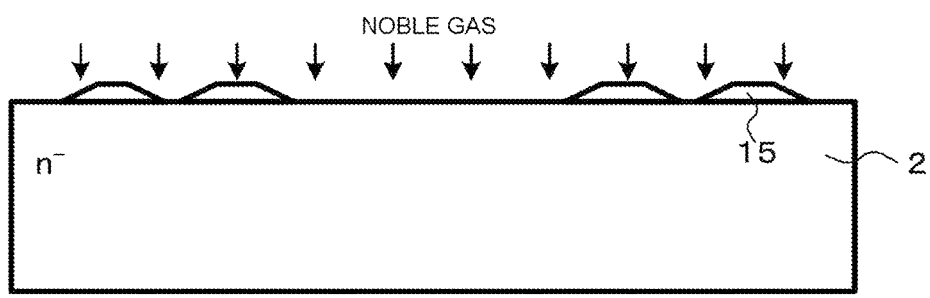
Figure 12:
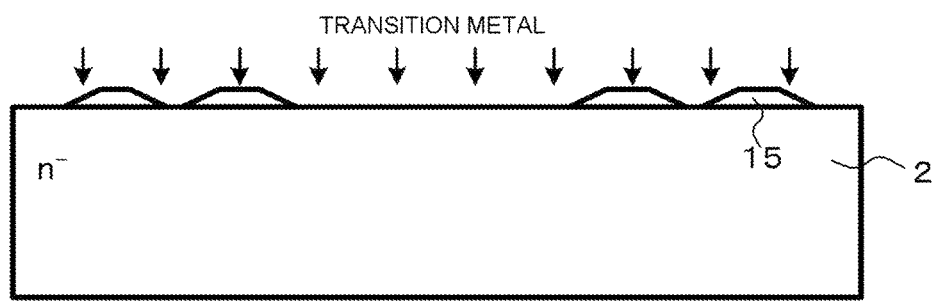

FIGS. 12A to 12C are main portion sectional views showing point defect introduction methods other than the silicon surface ion implantation method of FIG. 10B in the manufacturing method shown in Working Example 5 of the invention. FIG. 12A shows a method whereby a plasma treatment is carried out on the silicon surface. For example, when carrying out treatment for a long time with a $CF_4$+ $CCl_4$ mixed gas at a few hundred watts or more, the hole density near the surface increases. With the method of Working Example 6, it is possible to introduce the point defects into a shallower surface layer of n-type drift layer 2 than with the ion implantation used in Working Example 5. FIG. 12B shows the kind of method described in Working Example 3 whereby a noble gas is ion implanted into the silicon surface. As the noble gas element, there is He, Ne, Ar, Kr, Xe, or Rn. Also, the element may also be one that, although not a noble gas, exhibits a donor quality in silicon, as described in Working Example 4. As an element that becomes a donor, there is P, As, Se, S, H, O, Li, and the like. FIG. 12C shows a method whereby a transition metal is ion implanted into the silicon surface. It being sufficient that the transition metal is a metal that becomes an acceptor in silicon, as previously described, there is Pt, Pd, Ag, Au, Co, V, Ni, Fe, Cr, and Mn. Also, a transition metal the same as the transition metal introduced in the subsequent diffusion step (corresponding to FIG. 10C) may be ion implanted, or one of the other heretofore mentioned transition metals may be ion implanted.

Working Example 7

Next, a description will be given of the thickness of the $SiO_2$ oxide film that forms a mask for selectively forming the diffusion region of the transition metal such as platinum. As heretofore described, the oxide film is formed at the outset of the process, and the portion forming the transition metal diffusion region is selectively etched. The oxide film thickness necessary at this time can be calculated as in the following Equation 10. The concentration distribution of the transition metal in the presence of a diffusion source is given by $$N_{Si}(x_{Si}, t) = N_0 \text{erfc}\left(\frac{x_{Si}}{2\sqrt{D_{Si}t}}\right) \quad \text{Equation 10}$$

where $N_{Si}$ is the transition metal concentration, $N_0$ the surface transition metal concentration, $x_{Si}$ the distance the transition metal diffuses inside the silicon, $D_{Si}$ the diffusion coefficient of the transition metal in the silicon, t the diffusion time and erfc is the complementary error function. The diffusion coefficient $D_{Si}$ is $$D_{Si} = D_\infty \exp\left(-\frac{E_o}{kT}\right) \quad \text{Equation 11}$$

where $D_\infty$ s a constant, $E_a$ is activated energy, k is a Boltzmann constant, and T is the absolute temperature. When the transition metal is platinum, $E_a$ is approximately 2.0 eV. The diffusion coefficient of platinum at 900° C. is approximately 3.0E-8 $cm^2$/s. The thickness of the silicon substrate when diffusing the transition metal is, for example, 300 μm.

In the actual diffusion, the transition metal diffuses through the whole of the Si in a short time by an interstitial diffusion. For this reason, when the transition metal is, for example, platinum, the platinum concentration in the Si is 1.0E12/$cm^3$, and the diffusion depth 300 μm, when the diffusion temperature is 900° C. and the diffusion time one hour.

Taking the transition metal concentration in the Si in Equation 10 to be $N_{Si}$, when $N_{Si}$ is equal to the n-type wafer doping concentration (for example, 1.5E14/$cm^3$), $N_{Si}/N_0$ is 0.04, and $x_{Si}$=300 μm is obtained from the complementary error function (erfc).

In the same way, the diffusion of the transition metal in the oxide film is also expressed as $$N_{Ox}(x_{Ox}, t) = N_0 \text{erfc}\left(\frac{x_{Ox}}{2\sqrt{D_{Ox}t}}\right) \quad \text{Equation 12}$$

where $x_{ox}$ is the distance the transition metal diffuses from the oxide film surface, and $D_{ox}$ is the diffusion coefficient of the transition metal in the oxide film. The activation energy of platinum in the silicon oxide film is approximately 0.75 eV. For example, the diffusion coefficient of platinum in the silicon oxide film at a diffusion temperature of 900° C. is 3.0E-14/$cm^2$/s.

As an example, the time needed for the platinum to pass through an oxide film of 0.3 μm in a diffusion at 900° C. will be calculated. Taking $x_{ox}$ to be 0.3 μm and $N_{Ox}/N_O$ to be equal to 0.04 in Equation 12, t=1 hour is obtained from the complementary error function. That is, it can be said that with a platinum diffusion time of up to around one hour, masking is possible with a 0.3 μm thick oxide film. Actually, as the silicon side diffusion coefficient is larger at the Si/$SiO_2$ interface, there is a sucking of the platinum from the oxide film side toward the silicon side.

According to the above, when carrying out a platinum diffusion for one hour at 900° C. in silicon with a thickness of 300 μm, a selective diffusion is possible when using an oxide film with a thickness of 0.3 μm or more as a mask.

To generalize the above discussion, when the transition metal passes through an oxide film of a thickness $h_{Ox}$ in a diffusion time $t_d$, the diffusion distance $x_{ox}$ of the transition metal in the oxide film can be substituted with $h_{Ox}$, and Equation 12 becomes $$N_{Ox}(h_{Ox}, t_d) = N_D = N_0 \text{erfc}\left(\frac{h_{Ox}}{2\sqrt{D_{Ox}t}}\right) \qquad \text{Equation 13}$$

where $N_D$ is the n-type doping concentration, for example, the phosphorus concentration in the n-type drift layer. That is, provisionally taking the activation rate of the transition metal to be 100% for the sake of convenience, it is supposed that when the concentration of the transition metal reaches the concentration of $N_D$ or higher, the n-type inverts to a p-type. As the transition metal diffuses over the whole of the depth direction of the silicon substrate inside the silicon at this time, when substituting a diffusion distance $x_{Si}$ of the transition metal in the silicon with a thickness $h_{Si}$ of the silicon substrate, Equation 10 becomes $$N_{St}(h_{St}, t_d) = N_D = N_0 \text{erfc}\left(\frac{h_{St}}{2\sqrt{D_{St}t_d}}\right) \qquad \text{Equation 14}$$

From Equation 13 and Equation 14, $$N_0 \text{erfc}\left(\frac{h_{Si}}{2\sqrt{D_{Si}t_d}}\right) = N_0 \text{erfc}\left(\frac{h_{Ox}}{2\sqrt{D_{Ox}t_d}}\right) \qquad \text{Equation 15}$$

and consequently, $$\frac{h_{Si}}{h_{Ox}} = \sqrt{\frac{D_{Si}}{D_{Ox}}} \approx 1000 \qquad \text{Equation 16}$$

As the diffusion of the transition metal in Si is generally an interstitial diffusion, the maximum diffusion depth in the silicon is the Si thickness itself. Therefore, when the mask oxide film thickness is constant, the maximum diffusion depth in the silicon is determined by the square root of the diffusion coefficient ratio between the transition metal in the silicon and that in the oxide film. That is, this does not depend at all on parameters such as the concentration of the transition metal in the silicon or diffusion time. Although the activation energy of the transition metal diffusion differs between the silicon and oxide film, the temperature at which platinum is diffused is normally between 800° C. and 1,000° C., and the change in diffusion coefficient is in the order of a single digit in either medium. Therefore, it may be considered that a diffusion coefficient ratio at a different temperature barely changes. Therefore, using the values of each diffusion coefficient at 900° C., the square root of the ratio between the diffusion coefficient of platinum in the silicon and the diffusion coefficient of platinum in the oxide film is 1,000.

According to the above analysis, when the mask oxide film thickness is determined, the maximum diffusion depth in the silicon is unambiguously determined. That is, taking the minimum thickness for preventing the encroachment of platinum into the silicon to be $h_{th}$, $h_{th}$ is $$h_{Si}\sqrt{\frac{D_{Ox}}{D_{St}}} \equiv h_{th} \qquad \text{Equation 17}$$

For example, when the Si thickness is 300 μm, as previously described, the minimum necessary oxide film thickness $h_{th}$ from Equations 17 and 16 is 0.3 μm. Therefore, provided that the oxide film is thicker than this, a selective introduction of platinum is possible. Although the analysis so far has considered diffusion in the presence of a diffusion source, even when the total impurity amount of a transition metal such as an ion implantation is constant, the result is the same as in Equation 16. For this reason, the minimum oxide film thickness necessary for a selective introduction into the Si may be the same thickness.

From the above consideration, it is sufficient that the thickness $h_{ox}$ of the oxide film that forms the mask necessary when selectively introducing the transition metal into the silicon satisfies $$h_{OX} \geq h_{Si}\sqrt{\frac{D_{Ox}}{D_{Si}}} \qquad \text{Equation 1}$$

Working Example 8

Next, a description will be given of the necessary form of the oxide film 15 that forms a mask for obtaining the end portion form of the p-n junction with the curvature described in Working Example 1.

In order to form the form of p-type anode layer 5 of active region end portion 18 described in Working Example 1, it is necessary to determine the thickness $h_{ox}$ of oxide film 15 and the horizontal direction length $L_{OT}$ of the tapered portion of oxide film 15 in active region end portion 18, as shown in FIG. 2. From FIG. 2, an angle of inclination α of the tapered portion of oxide film 15, using $h_{th}$, can be expressed as $$\frac{h_{Ox}}{L_{OT}} \leq \tan\alpha = \frac{h_{th}}{\eta x_j} \qquad \text{Equation 18}$$

Herein, η is the ratio between $L_j$ and $x_j$ ($L_j/x_j$), and is a coefficient satisfying 1 or more, which is the preferable range described in Working Example 1. That is, in order to obtain a cylindrical junction (or spherical junction) with as large a curvature radius as possible, it is preferable that the ratio between the oxide film thickness $h_{ox}$ and the horizontal direction length $L_{OT}$ of the tapered portion is smaller than the tangent of the angle of inclination α. Therefore, it is preferable that $L_{OT}$ satisfies the following equation.

$$L_{OT} \geq \eta \frac{h_{Ox}}{h_{th}} x_j \qquad \text{Equation 19}$$

For example, the transition metal is taken to be platinum, and the diffusion temperature of the platinum 930° C. Taking the thickness ($h_{Si}$) of the silicon substrate when diffusing the platinum to be 300 μm, according to the description of Working Example 7, the ratio of Equation 16 barely changes even when the diffusion temperature is 930° C., meaning that $h_{th}$ is 0.3 μm. Meanwhile, when determining the silicon oxide film thickness $h_{ox}$ when carrying out the platinum diffusion, a margin is provided in the thickness of the silicon oxide film in order to reliably prevent the platinum from encroaching into the silicon below the oxide film. For example, the thickness of the oxide film before the platinum diffusion is taken to be 1.0 μm. The thickness of the oxide film may include a deposited film, such as phosphorus glass, as well as the thermal oxidation film. Then, the depth $x_j$ of the p-type inversion advancement region formed by the platinum acceptor transition is taken to be 1.0 μm. The previously mentioned η is taken to be, for example, simply 1. When these values are substituted into equation 19, it is preferable that $L_{OT}$ is 3.3 μm or more. When the oxide film is still thicker, $L_{OT}$ needs to be longer than 3.3 μm. Also, when increasing the ratio η between $L_j$ and $x_j$ from 1 to 2, $L_{OT}$ becomes 6.6 μm or more.

According to the above discussion, it is sufficient to control the oxide film etching in such a way that the length $L_{OT}$ of the component of the tapered portion of the oxide film parallel to the silicon surface satisfies Equation 19. Control of the oxide film etching means controlling the extent of damage provided on the oxide film surface layer and conditions of the plasma treatment determining this, and controlling the HF temperature, the time for which the silicon substrate is immersed in the HF, and the like.

Working Example 9

Next, a description will be given of Working Example 9, which is a preferable form of the aperture portion end portion of the oxide film that forms a mask.

Figure 13:
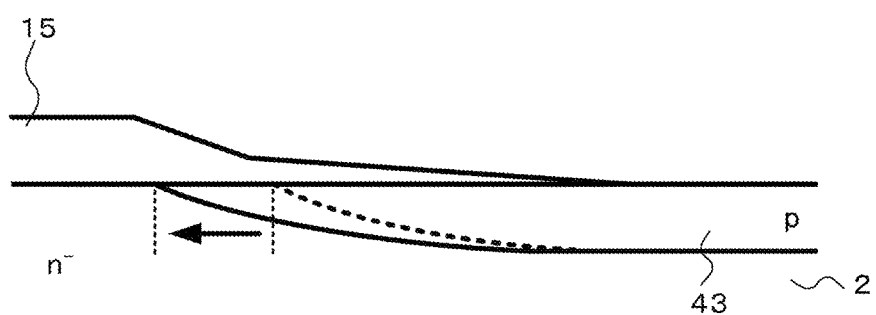
FIGS. 13A and 13B are main portion sectional views of a semiconductor device according to Working Example 9 of the invention.
Figure 13:
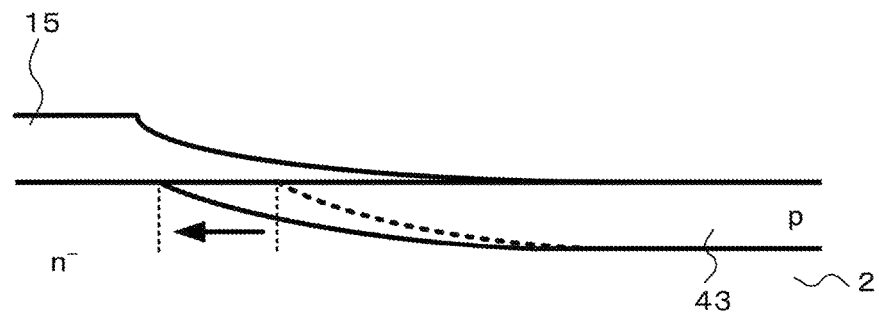

FIGS. 13A and 13B are main portion sectional views showing a more preferable form of the mask oxide film of Working Example 7 of the invention. A characteristic of Working Example 9 is that the inclined surface of the taper of the aperture end portion of the oxide film 15 is changed from the flat inclined surface shown in Working Example 1 to an inclined surface with a downward convex, as shown in FIGS. 13A and 13B.

As a form with a downward convex, there is a combination of two or more kinds of flat inclined surface, as in FIG. 13A, a curved flat surface, as in FIG. 13B, and the like.

In the cylindrical junction or spherical junction, the electric field intensity that increases when a reverse bias voltage is applied increases along with the curvature of the curved portion near the flat junction end portion. Therefore, when adopting a form with a downward convex for the taper, the curvature of a portion in which the curving starts can be made small, and the p-n junction extends to the outer peripheral side (the left side in the drawings). Therefore, it is possible to alleviate the electric field intensity of the curved portion. Also, when making the width of the curved portion of the p-n junction end portion the same, it is possible to make the width of the taper smaller with the form with the downward convex.

Figure 14:
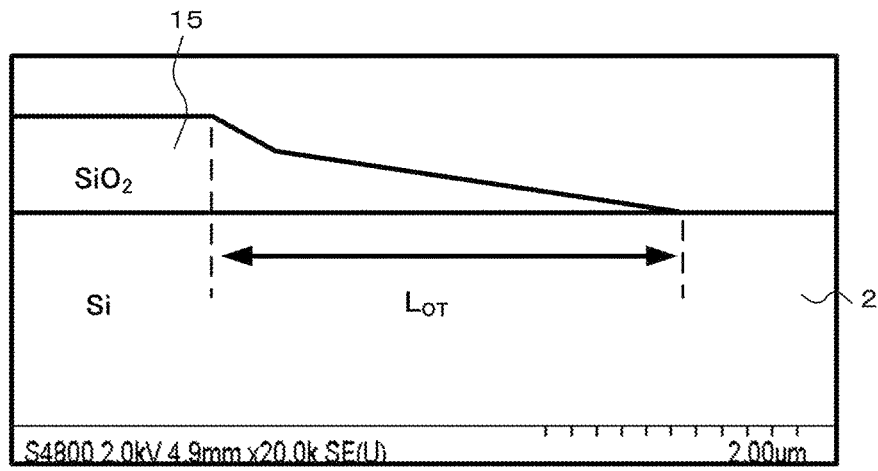
FIGS. 14A and 14B are main portion sectional views based on main portion sectional photographs of the semiconductor device according to Working Example 9 of the invention and a heretofore known semiconductor device.
Figure 14:
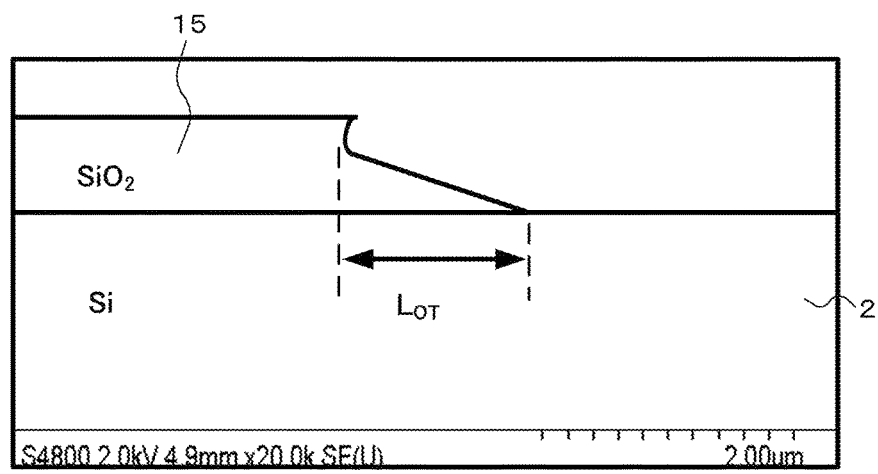

FIGS. 14A and 14B are sectional views showing forms etched with hydrofluoric acid (HF) after a plasma treatment on the oxide film surface, and are drawings wherein the boundary between oxide film 15 (SiO2) and the silicon (Si) is extracted from an electron microscope photograph. The silicon in FIGS. 14A and 14B is n-type drift layer 2 in the diode. FIG. 14A shows the end portion of the oxide film etched with HF, with a photoresist as a mask, after a plasma treatment is carried out for 20 seconds in plasma of a $CF_4+CCl_4$ mixed gas with a power of 300 W on the oxide film doped to a high concentration with phosphorus. As opposed to this, FIG. 14B shows the end portion of the oxide film wherein the oxide film is etched with HF without the plasma treatment being carried out. It is clear that, owing to the plasma treatment on the oxide film, the oxide film inclined portion length $L_{OT}$ increases, the taper angle becomes gentler, and moreover, the tapered portion has a form with a downward convex. Apart from the plasma treatment, virtually the same etched form is also obtained from a phosphorus ion implantation with a dose of 1E14/$cm^2$, and an accelerating voltage of 50 keV.

Working Example 10

Next, as Working Example 10, a description will be given of an introduction of surface damage of the oxide film that forms a mask, and of a side etching advantage.

Figure 15:
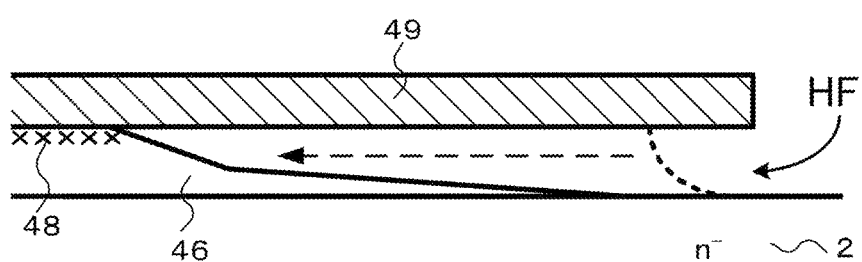
FIG. 15 is a main portion sectional view of a semiconductor device according to Working Example 10 of the invention.

FIG. 15 is a main portion sectional schematic view showing a method of forming the form of the mask oxide film of Working Example 9 of the invention. A characteristic of Working Example 10 is that damage 48 is introduced into the surface layer of, for example, phosphorus glass 46 acting as the oxide film, and a wet etching is carried out using HF. Herein, damage means that a condition in which the bonding of atoms or molecules of the insulating film are cut, or a condition in which there are irregular scratches or irregularities over a longer distance (a so-called rough condition), is formed on the surface of a uniformly formed insulating film, or the like.

Phosphorus glass 46 (of course, a normal thermal oxide film is also acceptable) to whose surface the damage is provided is such that the etching rate of the wet etching carried out with HF increases, particularly in the surface portion thereof. As a result of this, the etching of the oxide film surface proceeds swiftly in accordance with the extent of the damage, and the surface takes on a tapered form, as will be described hereafter. With a wet etching in particular, the etchant can seep between the photo resist and the insulating film in accordance with the damage, and it is possible to form a still more tapered form.

Working Example 11

Next, as Working Example 11, a description will be given of a method, different from the method of Working Example 5, of introducing damage to the surface of the oxide film that forms a mask.

Figure 16:
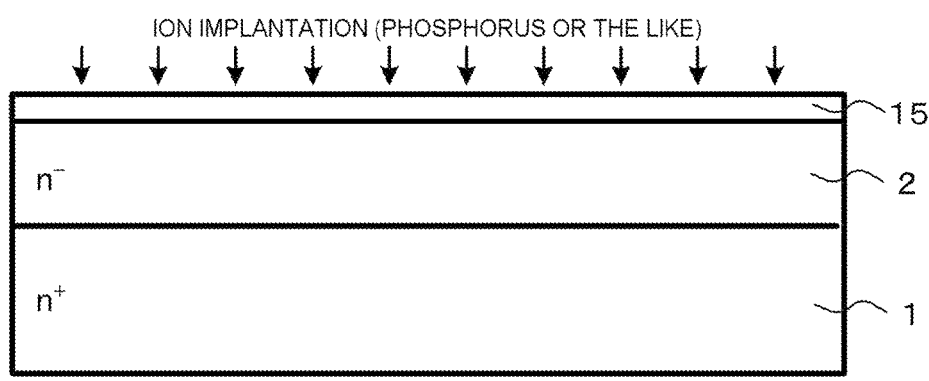
FIGS. 16A and 16B are main portion sectional views showing manufacturing steps of a semiconductor device according to Working Example 11 of the invention.
Figure 16:
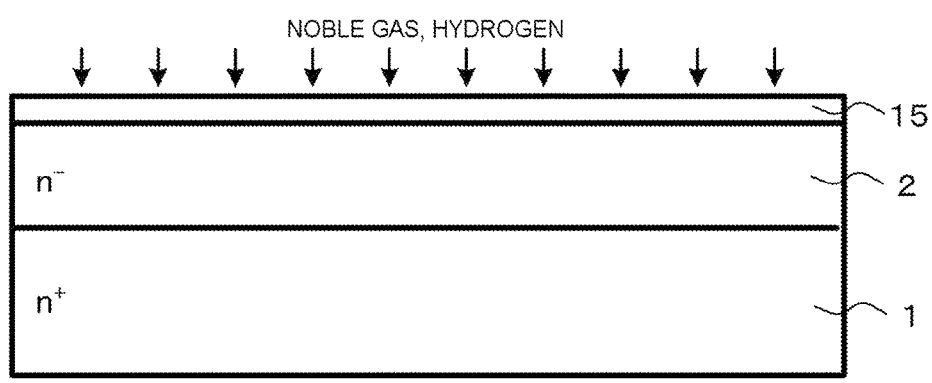

FIGS. 16A and 16B are main portion sectional views showing an introduction method using an ion implantation method as a method of introducing damage to the surface layer of the mask oxide film of Working Example 9 of the invention. In FIG. 16A, damage is introduced into the surface layer of the oxide film 15 using an ion implantation. As the implanted ions are of an element that dopes silicon, such as silicon, phosphorus, arsenic, or boron, any element that can be ion implanted is acceptable. Also, of course, a compound such as $BF_2$ is also acceptable. However, with an element that induces a charge in the oxide film, for example, a rare earth such as Na, care is necessary with the introduction conditions thereof. FIG. 16B shows an example with, of those, hydrogen and a noble gas.

As the damage is introduced to the oxide film surface by ion implantation, it is possible to promote side etching.

Working Example 12

Figure 17:
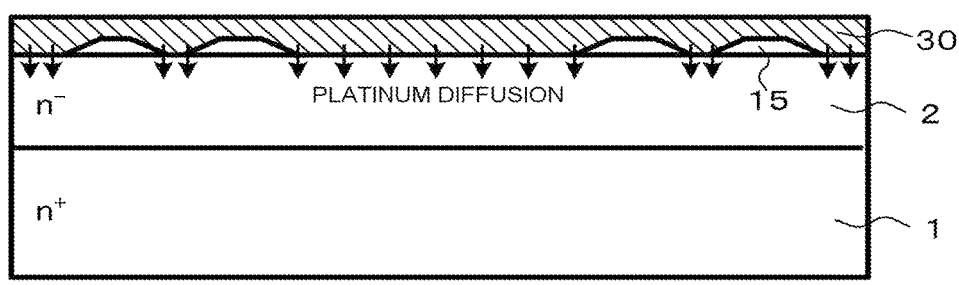
FIGS. 17A to 17C are main portion sectional views showing manufacturing steps of a semiconductor device according to Working Example 12 of the invention.
Figure 17:
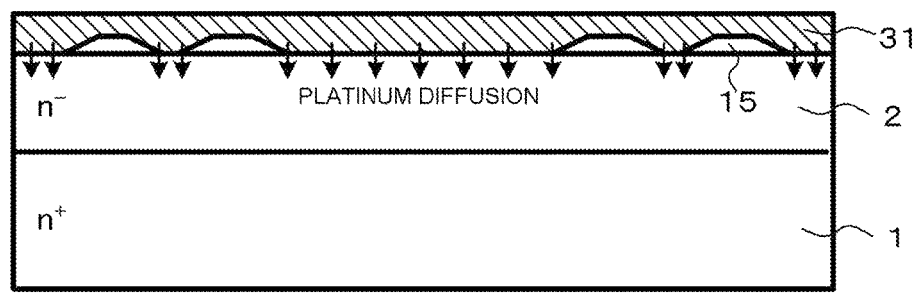
Figure 17:
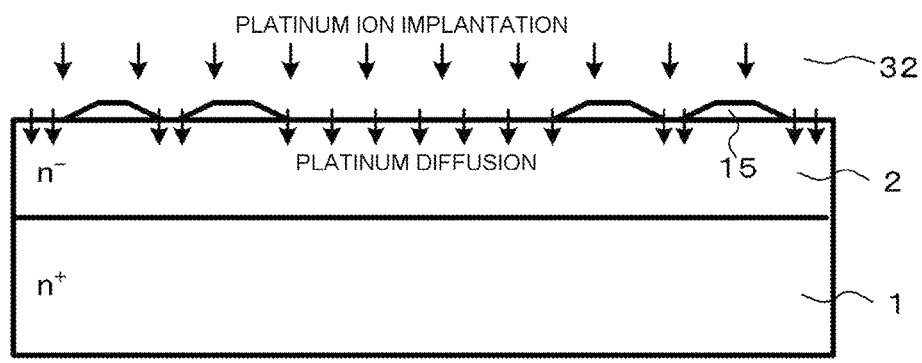

Next, as Working Example 12, a description will be given of a method, different from the method of Working Example 5, of introducing a transition metal. FIGS. 17A to 17C are main portion sectional views showing a transition metal (hereafter, platinum) introduction method different from that of Working Example 5 of the invention.

In FIG. 17A, after oxide film 15 is opened, unlike in Working Example 5, silica paste 30 including platinum is applied to the surface of n-type drift layer 2, and heated for ten minutes to 2 hours at a temperature in the order of 800 to 1,000° C., diffusing the transition metal. This is particularly good in the event that the thermal budget is smaller than in Working Example 5. For example, the diffusion temperature is 800 to 900° C., and the diffusion time ten minutes to one hour. In Working Example 12, these are taken to be 850° C. and 30 minutes. Compared with the rear surface application diffusion of Working Example 5, it is possible to distribute more platinum on the upper surface side of the silicon substrate than on the lower surface side. For this reason, as p-type anode layer 5 side becomes relatively shorter than n-type semiconductor substrate 1, the lifetime of the minority carriers in n-type drift layer 2 has a soft recovery.

In FIG. 17B, after oxide film 15 is opened, platinum is deposited on the surface of n-type drift layer 2 using a vapor deposition or sputtering and, as well as platinum silicide 31 being formed by heat treatment at a temperature in the order of 1,000° C., platinum from platinum silicide 31 is diffused in the silicon. Alternatively, the platinum may be patterned in such a way as to remain only in, and in the vicinity of, the aperture portion of oxide film 15, and platinum silicide 31 formed subsequently by heat treatment. As the kind of interface irregularity caused by Si movement seen at the interface of an Al—Si alloy and Si does not occur, the interface of platinum silicide 31 and Si is flat, and there is no spiking of the Si either. For this reason, breakdown voltage, leakage current, and contact resistance are also stable over a long period. Of the previously mentioned transition metals other than platinum too, Pd (palladium), Au (gold), Co (cobalt), V (vanadium), Ni (nickel), Fe (iron), Cr (chromium), and Mn (manganese) are preferable, as they form silicides.

When a p-type anode layer is formed using the inversion advancement effect of the acceptor transition of a transition metal and an acceptor transition owing to point defects, as in the invention, the diffusion depth (Xj) is relatively small compared with a normal formation using a boron heat diffusion. For this reason, when bringing an anode of Al or an Al—Si alloy into direct contact with the p-type anode layer, the probability of the spiking or irregularity reaching the p-n junction increases. As a result of this, a leakage current defect or breakdown voltage defect is liable to occur. Therefore, as it is possible to form a much flatter silicon interface by using a transition metal silicide, it is also possible to reduce the above-mentioned defects.

In FIG. 17C, after oxide film 15 is opened, platinum ion implantation 32 is carried out, and a heat diffusion is carried out at a temperature of 800 to 1,000° C. As it is possible to accurately control the dose with the implantation beam current, platinum ion implantation 32 is preferable when more precisely forming the amount of platinum introduced. Of course, an ion implantation of the heretofore mentioned transition metals other than platinum is also possible.

Working Example 13

Next, as Working Example 13, a description will be given of a transition metal introduction method and a p-type anode layer modification example.

Figure 18:
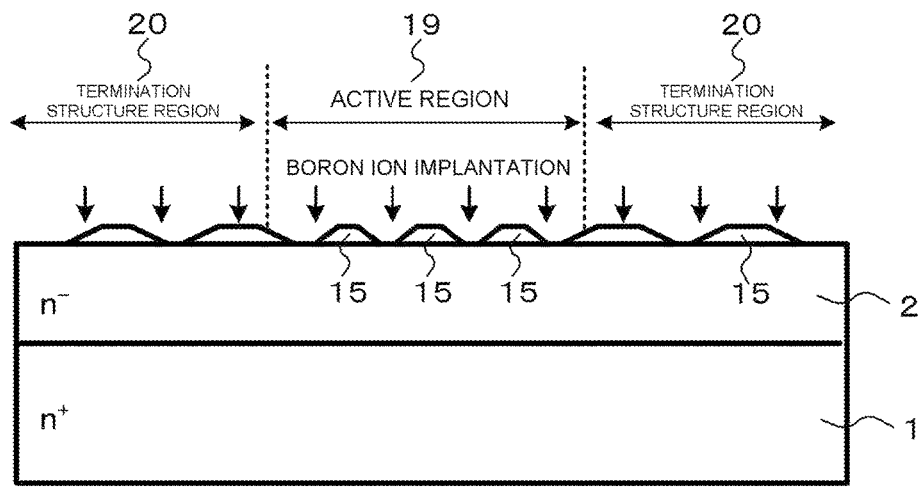
FIGS. 18A and 18B are main portion sectional views showing manufacturing steps of a semiconductor device according to Working Example 13 of the invention.
Figure 18:
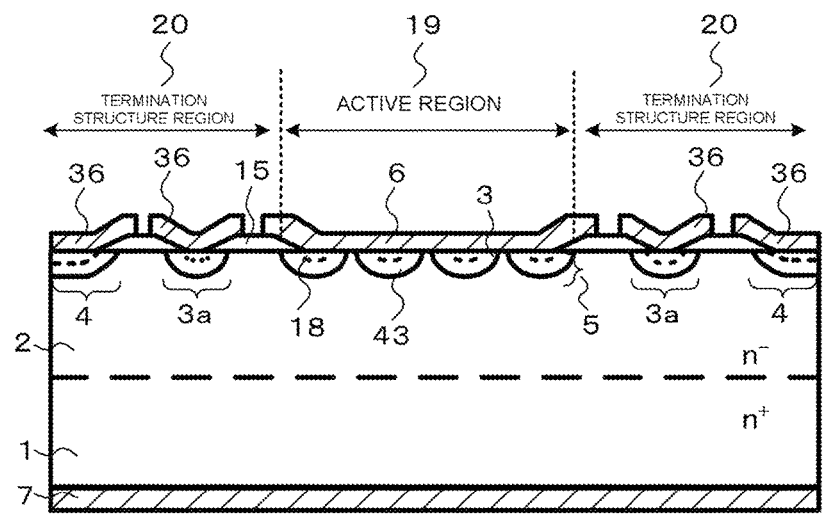

FIG. 18A is a sectional schematic view showing a modification example of the step (FIG. 10B) of introducing the point defects of Working Example 5 of the invention. As shown in FIG. 18A, patterning is done in such a way that oxide film 15 selectively remains in portions of active region 19 into which the point defects are not introduced. Subsequently, an ion implantation of boron or the like, or a plasma damage treatment, is carried out. A characteristic of the modification example is that, by selectively introducing the point defects into active region 19 in this way, the acceptor transition of the transition metal is advanced only in the regions into which the point defects are introduced. The anode is of Al or an Al—Si alloy, or of a silicide of one of the previously mentioned transition metals, or the like. Besides this, in FIG. 18B, n-type drift layer 2 forms a region that comes into direct contact with anode 6, without p-type anode layer 5 intervening, by introducing the point defects at a comparatively low concentration, or by making the amount of the transition metal introduced comparatively small. Herein, n-type drift layer 2 and anode 6 form a Schottky contact. The anode is of Al or an Al—Si alloy, or of a silicide of one of the previously mentioned transition metals, or the like.

Figure 19:
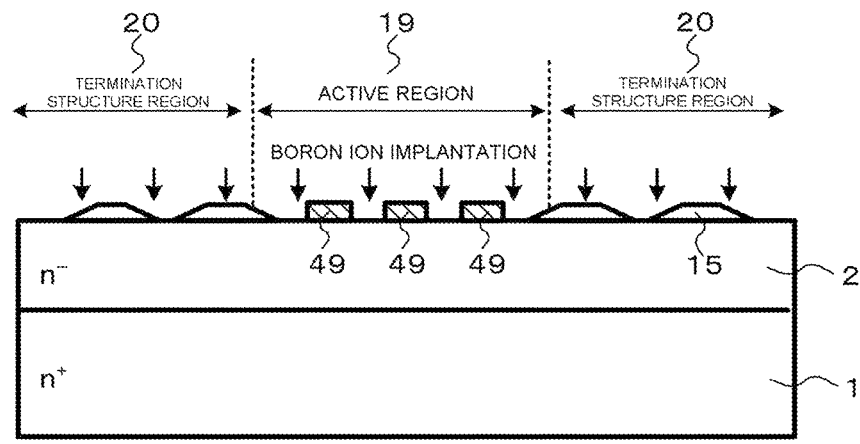
FIGS. 19A and 19B are main portion sectional views showing manufacturing steps of the semiconductor device according to Working Example 13 of the invention.
Figure 19:
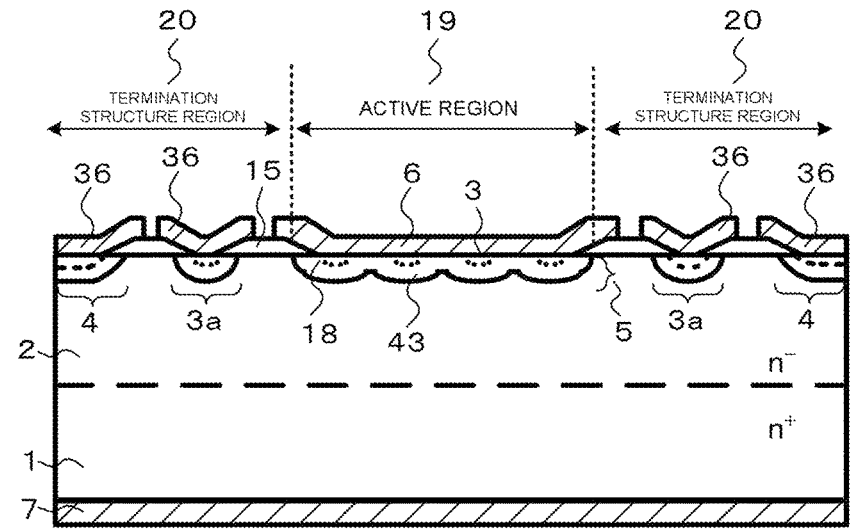

Besides this, in the step (FIG. 10B) of introducing the point defects in Working Example 5 of the invention, photoresist 49 is formed in portions of active region 19 into which the point defects are not introduced, and ions of boron, or the like, are implanted, as shown in FIG. 19A. As shown in FIG. 19B, by selectively introducing the point defects into active region 19, the acceptor transition of the transition metal is advanced only in the regions into which the point defects are introduced. Furthermore, n-type drift layer 2 forms a region that comes into direct contact with anode 6, without p-type anode layer 5 intervening, by introducing the point defects at a comparatively low concentration, or by making the amount of the transition metal introduced comparatively small. The anode is of Al or an Al—Si alloy, or of a silicide of one of the previously mentioned transition metals, or the like. By doing as heretofore described, the point defects are selectively introduced and, although the region into which the point defects are introduced is p-type region 3, the whole p-type anode layer 5 is of a structure wherein it is connected over the whole of active region 19.

By selectively leaving oxide film 15 in active region 19, and by introducing the point defects at a comparatively low concentration, or making the amount of the transition metal introduced comparatively small, as in FIGS. 18A and 18B, it is also possible to obtain the kind of p-type anode layer 5 form of FIG. 19B. Furthermore, with the method whereby the point defects are selectively introduced into active region 19 using a resist, as in FIGS. 19A and 19B, it is also possible to obtain the kind of p-type anode layer 5 form of FIG. 18B.

Also, the aperture portions of oxide film 15 remaining after etching in active region 19 are made a cyclically repeating pattern of, for example, narrow stripes. Alternatively, it is also possible to make the aperture portions dots distributed in a triangular lattice, rectangular lattice, or hexagonal lattice, or rings distributed in the same way. By adopting the above kinds of distribution pattern for the aperture portions of oxide film 15, p-type anode layer 5 is regularly distributed in accordance therewith, meaning that it is possible to reduce the implantation efficiency of the minority carriers without causing a deterioration of the breakdown voltage. Furthermore, the regions in which oxide film 15 remains and the regions in which oxide film 15 is opened may be inverted in only active region 19 and active region end portion (corresponding to active region end portion 18 of FIG. 2).

As the effective dose of p-type anode layer 5 decreases by selectively introducing the point defects into the active region as heretofore described, the implantation efficiency of the minority carriers decreases, and the minority carriers have a soft recovery.

Working Example 14

Next, as Working Example 14, a description will be given of a method whereby an FZ bulk wafer, rather than an epitaxial wafer, is used for the semiconductor substrate.

FIGS. 20A to 20F are a flow diagram of main portion sectional portions showing a manufacturing method of the invention in Working Example 14. Hereafter, a description is given with platinum as the transition metal, but of course, manufacture is possible in the same way using another heretofore mentioned transition metal too.

FIG. 20A

Figure 20:
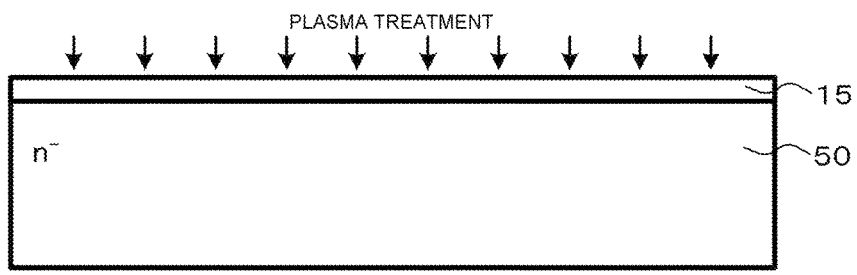
FIGS. 20A to 20F are main portion sectional views showing manufacturing steps of a semiconductor device according to Working Example 14 of the invention.
Figure 20:
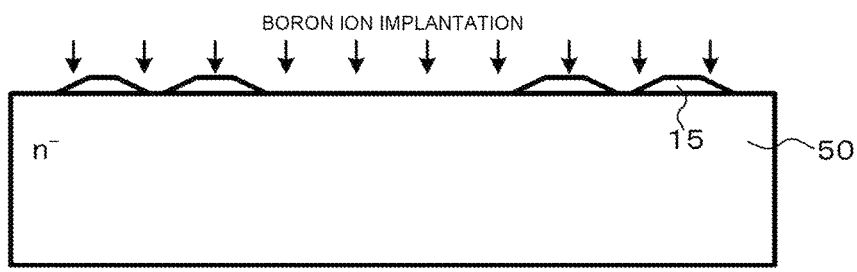
Figure 20:
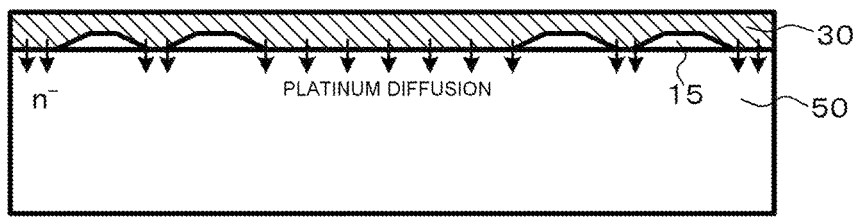
Figure 20:
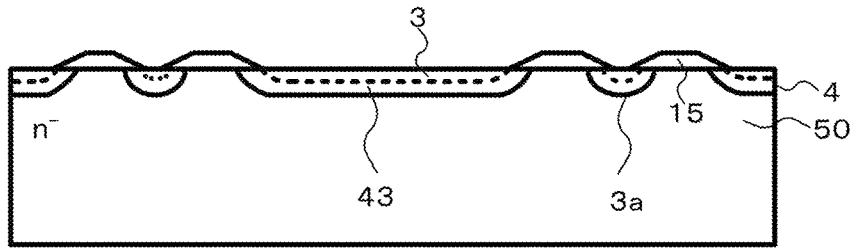
Figure 20:
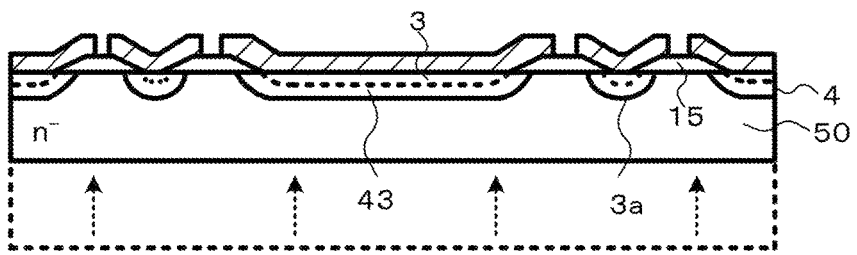
Figure 20:
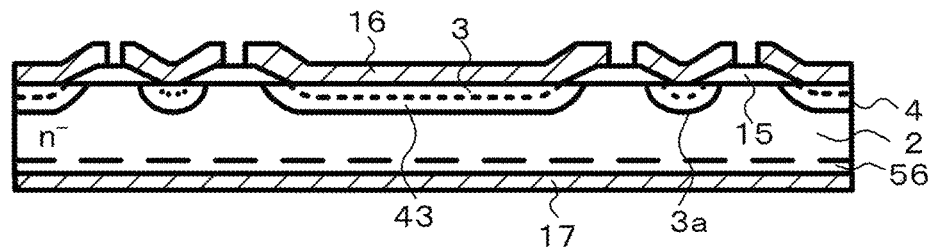

Firstly, oxide film 15 with a thickness of, for example, 900 nm is formed by thermal oxidation on the upper surface of n-type FZ substrate 50 with an impurity concentration of $2E14/cm^3$, and a thickness of 400 µm. Next, phosphorus glass is formed on oxide film 15 surface by carrying out a heating process for several hours at around 1,000° C. under a $POCl_3$ gas atmosphere. It is taken that oxide film 15 shown in FIGS. 20A to 20F includes phosphorus glass in the upper surface layer thereof. Next, a plasma treatment is carried out on oxide film 15 surface for 20 seconds in plasma of a $CF_4+CCl_4$ mixed gas with a power of 300 W. A condition in which the steps so far are finished is shown in FIG. 20A.

FIG. 20B

Then, a portion of the oxide film in which the p-type inversion advancement region is subsequently formed is removed using a photolithography technique and etching. Continuing, B (boron) is ion implanted into n-type drift layer 2, with the remaining portion of oxide film 15 as a mask. The dose at this time is $5E15/cm^2$, and the accelerating voltage is 50 kV. A condition in which the steps so far are finished is shown in FIG. 20B.

FIG. 20C

Furthermore, a silica paste including 1% platinum by weight is applied to the upper surface of FZ substrate 50, and heat processing is carried out at 930° C. for one hour. A condition in which the steps so far are finished is shown in FIG. 20C.

FIG. 20D

Subsequently, only the applied silica paste is removed by controlling the HF etching time. By so doing, the surface vicinity of the active region of n-type drift layer 2 and the surface vicinity of the termination structure region are inverted to p-type, and inversion advancement region 43 is formed. A condition in which the steps so far are finished is shown in FIG. 20D.

FIG. 20E

Continuing, for example, an Al—Si alloy is deposited by sputtering to a thickness of 5 µm on the wafer surface. Then, the Al—Si alloy layer is patterned to a desired form using a photolithography technique and etching. Subsequently, heat processing (sintering) is carried out at 400° C. to 500° C. for one hour under an $N_2$ atmosphere, and low resistance anode 16 that comes into contact with p-type region 3 is formed. Anode 16 may also be formed by a vacuum deposition of pure Al. Also, a polyimide or silicon nitride film may be formed as a passivation film after the sintering, and only the anode pad (a region to which an aluminum wire or lead frame is connected when packaging the diode in resin or the like) opened. Continuing, grinding 51 is carried out from the rear surface side of FZ substrate 50 so that FZ substrate 50 has a thickness of, for example, 60 µm. A condition in which the steps so far are finished is shown in FIG. 20E.

FIG. 20F

Then, the ground surface is smoothed as necessary by a wet etching. Subsequently, in order to bring the rear surface of FZ substrate 50 and cathode 17 into contact at low resistance, an n-type dopant such as P or As is ion implanted at a dose of, for example, $1E15/cm^2$ from the rear surface of FZ substrate 50. Subsequently, a laser annealing or an annealing in an electric furnace is carried out so that the rear surface uppermost layer carrier concentration of the implanted dopant becomes $1E19/cm^3$ or more, forming n-type cathode layer 56. Then, cathode 17 is formed using a vacuum deposition or sputtering so as to come into contact with n-type cathode layer 56. A condition in which the steps so far are finished is shown in FIG. 20F.

When using FZ substrate 50 as in Working Example 14, the silicon substrate is lower priced than with the heretofore described epitaxially grown wafer. On the other hand, when using the FZ wafer, it is necessary to remove the rear surface silicon layer including the p-layer, using a mechanical grinding or chemical grinding, after the p-inversion layer is formed by the Pt diffusion. When grinding away the rear surface side of the FZ wafer before carrying out the platinum diffusion, the ground surface of the rear surface also has the same carrier concentration as n-type drift layer 2, meaning that the platinum segregates to the rear surface uppermost layer owing to the Pt diffusion, and the p-type inversion layer is also formed in the rear surface uppermost layer vicinity. In order to prevent this, for example, there is also a method whereby Pt is diffused from the front surface after the oxide film is formed on the rear surface but, even though no p-layer is formed, there is a reduction (an increase in low efficiency) in the carrier concentration on the rear surface uppermost side owing to the compensatory effect. For this reason, unless at least the region on the FZ wafer rear surface side to which the platinum segregates is ground away, the breakdown voltage and contact characteristics deteriorate. Therefore, by carrying out the grinding of the rear surface side at a stage after the platinum diffusion, as with the method of Working Example 14, it is easily possible to manufacture the diode of the invention at a low price, without the characteristics deteriorating.

Working Example 15

Figure 21:
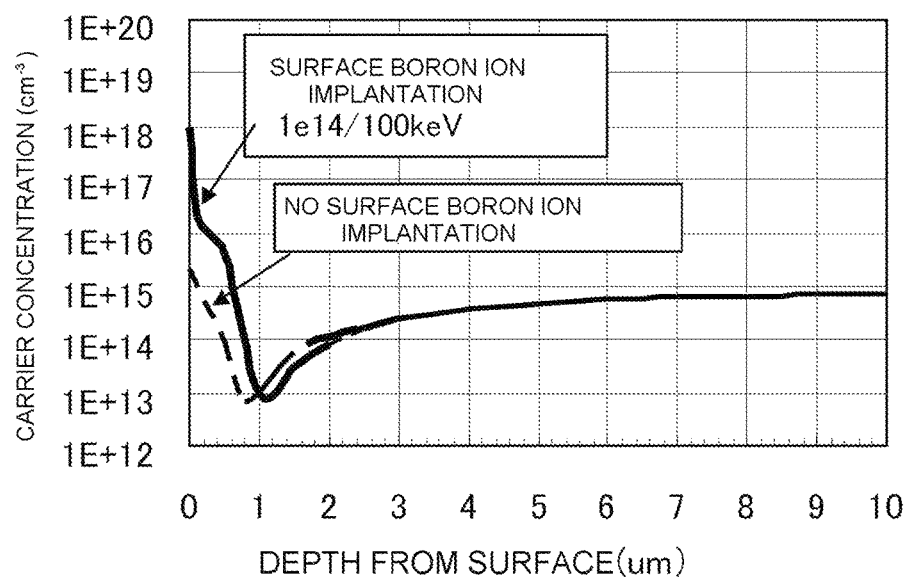
FIG. 21 shows a sectional concentration distribution of a semiconductor device according to Working Example 15 of the invention.

Next, a description will be given of the concentration distribution of the p-type anode layer and n-type drift layer up to 10 µm in the diode of Working Example 2 manufactured using the method of Working Example 5. FIG. 21 is a diagram of results of depth direction carrier concentration distributions in the active regions of diodes manufactured using the manufacturing method of Working Example 5 and a heretofore known manufacturing method, measured using spreading resistance measurements. The measurements have been carried out using a Solid State Measurements, Inc. spreading resistance measuring instrument SSM-2000. In the evaluation sample, a depth direction cross-section is exposed by a chamfering method, using a mount with an angle of 5° 44'. In the sample, after boron is ion implanted with a dose of $1E14/cm^2$ and an accelerating energy of 100 keV in order to introduce point defects, platinum is diffused under the conditions of Working Example 5. Meanwhile, a sample in which a platinum diffusion is carried out under the same conditions without carrying out the boron ion implantation is also prepared as a subject of comparison. The p-type layer formed by the platinum acceptor transition has a depth from the surface in a range of 0 to 1 μm. As is clear from FIG. 21, the sample in which boron ion implantation is carried out exhibits a p-type layer carrier concentration that is ten times or more higher. According to calculations using SRIM-2008, the results of implanting boron ions into the silicon under the heretofore described conditions are a range of 0.3 μm, and a boron distribution dispersion width of 0.09 μm. Herein, SRIM-2008 is ion implantation calculation software called The Stopping and Range of Ions in Matter, and can be downloaded from http://www.srim.org. Furthermore, the heat record after the boron ion implantation is 930° C. for one hour in the platinum diffusion step. For this reason, in the thermal budget of the platinum diffusion step, the boron becomes an acceptor without diffusing by the concentration distribution in the condition in which the boron is ion implanted being maintained. Meanwhile, the boron ion implantation concentration distribution of FIG. 21 is such that there is a region with a high concentration of $1E17/cm^3$ or more in the outermost layer (0 to 0.1 μm), after which, a region with a concentration of approximately $1E16/cm^3$ spreads to a depth of approximately 0.6 μm. That is, the p-type layer concentration increases in a portion deeper than 0.3 μm, which is the range of the B. This proves that the increase in concentration and the spread of diffusion is not due to the implanted boron becoming an acceptor, but due to the advantage of the point defects (particularly holes) introduced by the boron ion implantation markedly advancing the platinum acceptor transition. The point defects (holes, multi-holes, interstitial silicon, and the like) introduced when the boron ions are implanted are distributed slightly more deeply than the chemical concentration distribution of the boron (the concentration distribution of the boron itself, also including boron which is not electrically activated). When the platinum is diffused after the ion implantation, the platinum diffusion coefficient is high, meaning that, before the point defects are restored to a crystalline condition, the platinum diffuses through the whole of the silicon, and segregates to the surface layer of the silicon substrate. When segregating, the platinum also enters the interstitial position in accordance with the recovery of the point defects, and becomes an acceptor. Therefore, the higher the point defect concentration, the more the concentration of the platinum that has become an acceptor increases. The above effect is the inversion advancement effect of the point defects on the platinum. As the previously mentioned transition metals other than platinum also have a high diffusion coefficient in the same way as platinum, the same inversion advancement effect caused by the point defects occurs.

The concentration distribution of the point defects, particularly the holes, can be measured using a heretofore known positron annihilation method, provided that the hole concentration is at least $1E16/cm^3$. In the case of the invention, as the object of introducing the point defects is to advance the acceptor transition of the transition metal in order to form the p-type anode layer, the point defects are introduced at a concentration of $1E16/cm^3$ or more. Therefore, it is quite possible to measure the point defects (holes) using the positron annihilation method.

Working Example 16

Figure 22:
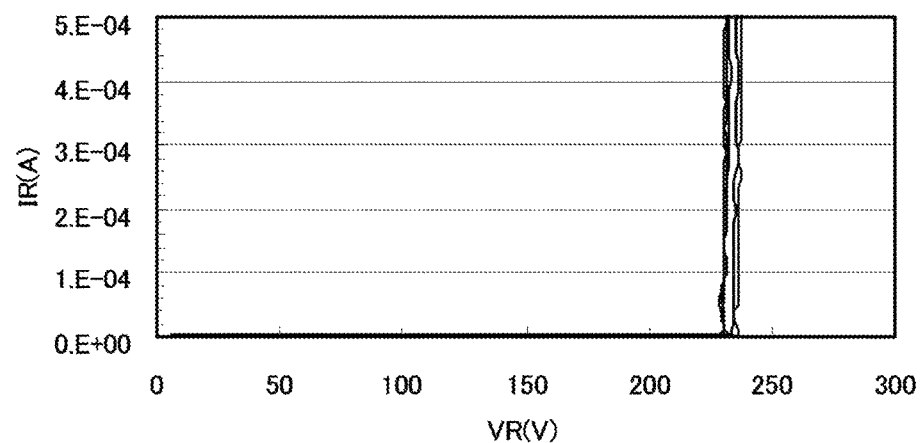
FIGS. 22A to 22C are electrical characteristic diagrams of the semiconductor device according to Working Example 16 of the invention.
Figure 22:
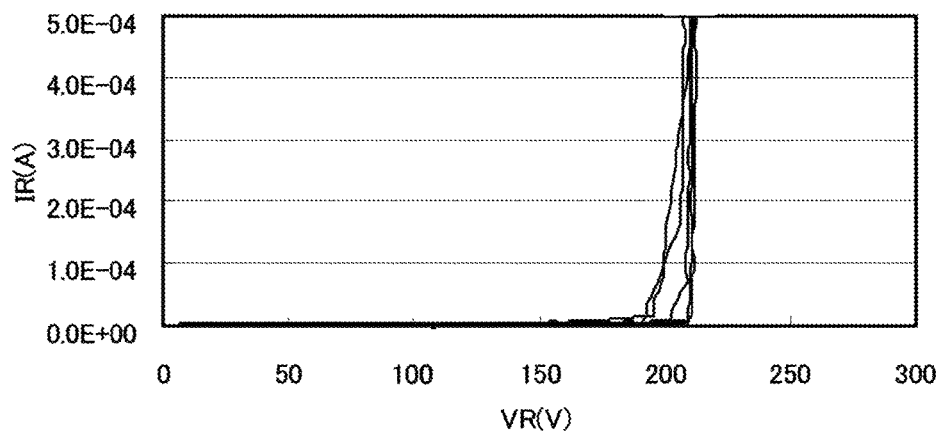
Figure 22:
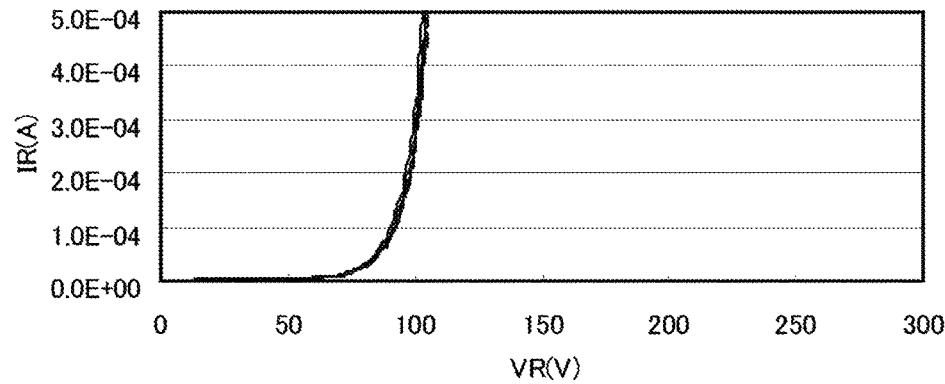
Figure 25:
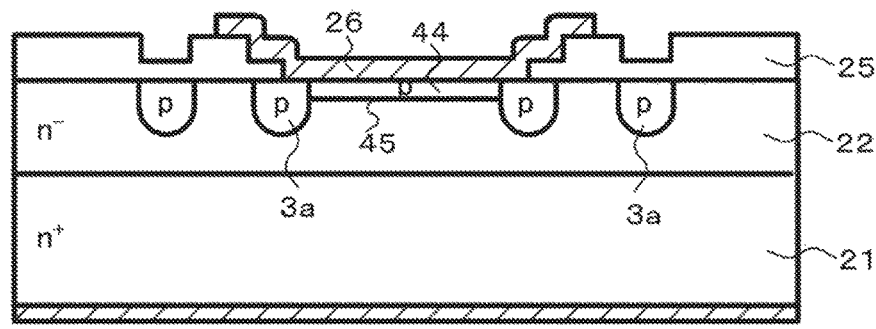
FIGS. 25A to 25E are main portion sectional views showing manufacturing steps of the semiconductor device according to the heretofore known example.

Next, a description will be given of breakdown voltage characteristic evaluation results in the diode of Working Example 2 manufactured using the method of Working Example 5. FIGS. 22A to 22C are characteristic diagrams comparing breakdown voltage waveforms of diodes manufactured using the manufacturing method of Working Example 5 and a heretofore known manufacturing method. The silicon layers (a high concentration layer and a low concentration epitaxial layer) have the same resistivity and film thickness as in the 200 V diode described in Working Example 2.

FIG. 22A shows the breakdown voltage waveform of the diode of Working Example 2 manufactured using the method of Working Example 5. There are 20 samples. The breakdown voltage is approximately 230 V in all the samples, and the current flowing through the diode has a waveform of only an avalanche current. Also, inconsistency among the samples is also extremely small.

FIG. 22B shows a diode wherein the oxide film is patterned using a wet etching, without carrying out a plasma treatment after the thermal oxide film formation, in the manufacturing method of Working Example 5. In the same way, there are 20 samples. The form of the end portion of the oxide film aperture portion at this time, not being the tapered form described in Working Example 8, is such that the $L_{OT}$ is 1.8 μm, which is less than twice the 1.0 μm diffusion depth of the p-type anode layer. With the samples of FIG. 22B, the breakdown voltage due to avalanche breakdown is approximately 200 V, which is a 30 V decrease compared with the case of FIG. 22A, and inconsistency is also observed. Furthermore, with one portion of the samples, a leakage current separate from the avalanche current is generated at a voltage of around 180 V, exhibiting a so-called soft breakdown voltage waveform. The reason the breakdown voltage decreases and a leakage current is also generated in this way is that, reflecting the form of the end portion of the oxide film aperture portion, the curvature radius $r_j$ of the cylindrical junction or spherical junction decreases, and the electric field intensity ratio β reaches a high value of 2 or more.

FIG. 22C shows the breakdown voltage waveform of a diode wherein the boron ion implantation for introducing the point defects is also omitted from the manufacturing method of FIG. 22B. The p-type anode layer concentration at this time is ten times or more lower than that in FIG. 22A or 22B. In the same way, there are 20 samples. It is clear from FIG. 22C that the breakdown voltage is only approximately 100 V, which is a reduction by half compared with FIG. 22B. Furthermore, it is clearly a soft breakdown voltage waveform, rather than a current caused by an avalanche breakdown. This is because the integrated concentration in the depth direction of the p-type anode layer is insufficient, and the depletion layer punches through to the anode. Also, as a result of observing localized heat generating points using a liquid crystal application, it is confirmed that heat generating portions thought to be due to an electric field concentration exist in the four corners (the oxide film boundary vicinity) of the p-type anode layer whose surface has a rectangular form. That is, it is thought that, due to the electric field concentration, the punching through of the depletion layer to the anode occurs at the four corners.

Herein, the relationship with the results in FIG. 21 is also important. Assuming that the increase in the p-type anode layer concentration in FIG. 21 is caused simply by the surface boron ion implantation, the p-n junction form of the end portion of the p-type anode layer should not depend on the tapered form of the oxide film aperture end portion either. This is because the boron depth distribution is determined by the ion implantation, and being taken into the oxide film in the way of platinum becomes irrelevant. Therefore, FIG. 22B too needs to have the same characteristic results as FIG. 22A. Despite this, the breakdown voltage in FIG. 22B is clearly lower than that in FIG. 22A, and has a soft breakdown voltage waveform. Therefore, these differences in characteristics are convincing evidence proving the following three points. The first is that the p-type anode layer concentration increases owing to the platinum acceptor transition being advanced by the introduction of the point defects by the boron ion implantation. The second is that, by making the form of the oxide film aperture end portion a tapered form, the platinum horizontal direction concentration distribution, that is, the p-n junction, can also have a large curvature radius. Then, the third is that, because it is a transition metal, the form of the p-n junction reflects the form of the oxide film aperture end portion.

The above results clearly show that it is possible to stably form the p-n junction with a Pt diffusion by using the method of the invention.

Working Example 17

Next, as Working Example 17, a description will be given of a method whereby, after causing the transition metal to become an acceptor and forming the p-type anode layer in the manufacturing method of Working Example 5, an inter-layer insulating film is newly formed.

FIG. 23A is a sectional view of a first diode manufactured according to Working Example 17. After causing the transition metal to become an acceptor and forming the p-type anode layer in the manufacturing method of Working Example 5, the whole of the oxide film used in the selective diffusion of the transition metal is once removed. After the oxide film is removed, inter-layer insulating film 47 is newly deposited and, after patterning using a photolithography method, the anode 16 is formed. By so doing, it is possible to use a film that does not include the transition metal as inter-layer insulating film 47, meaning that it is possible to lower the fixed charge and surface charge of inter-layer insulating film 47, and it is possible to prevent deterioration of the breakdown voltage.

FIG. 23B is a sectional view of a second diode manufactured according to Working Example 17. After causing the transition metal to become an acceptor and forming the p-type anode layer in the manufacturing method of Working Example 5, inter-layer insulating film 47 is newly deposited and, after patterning using a photolithography method, the anode 16 is formed. By so doing, it is possible to make the distance from the surface layer of n-type drift layer 2 to the anode 16, or in the same way, to a field plate (not shown), the total thickness of initial oxide film 15 and inter-layer insulating film 47. For this reason, as it is possible to alleviate concentration of equipotential surfaces when there is a reverse bias in the insulating film, it is possible to prevent a decrease in breakdown voltage.

Working Example 18

Next, as Working Example 18, a description will be given of a modification example of the diode manufacturing method of Working Example 5.

FIGS. 26A to 26E are a flow diagram of main portion sectional portions of a manufacturing method of Working Example 18 of the invention.

FIG. 26A

Figure 26:
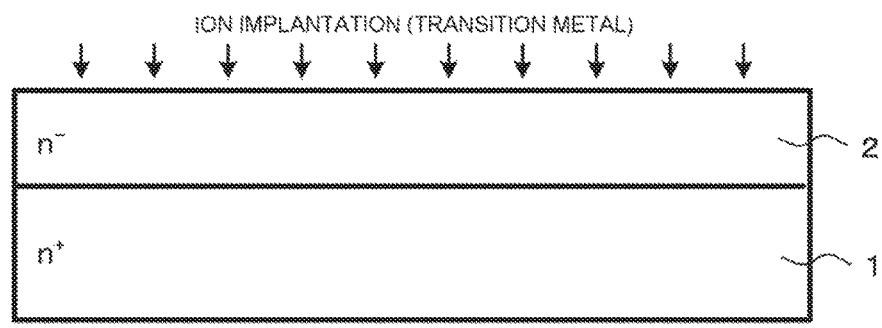
FIGS. 26A to 26E are main portion sectional views showing manufacturing steps of a semiconductor device according to Working Example 18 of the invention.
Figure 26:
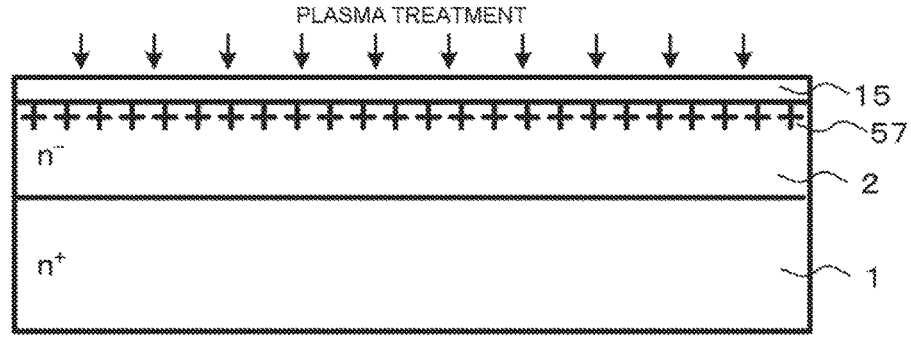
Figure 26:
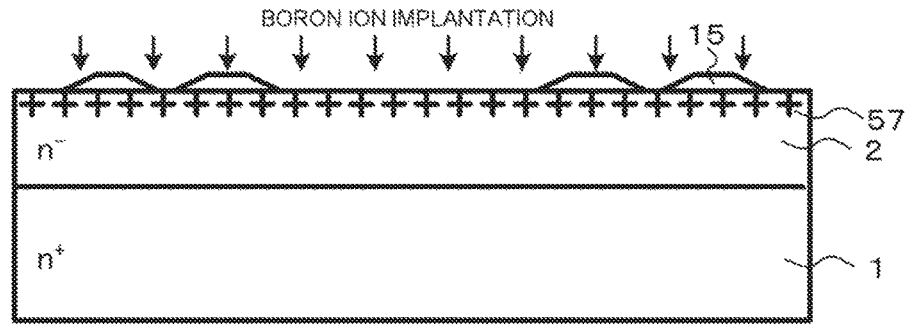
Figure 26:
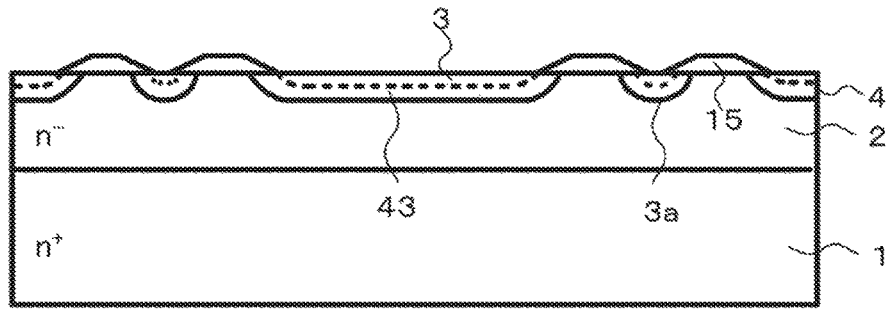
Figure 26:
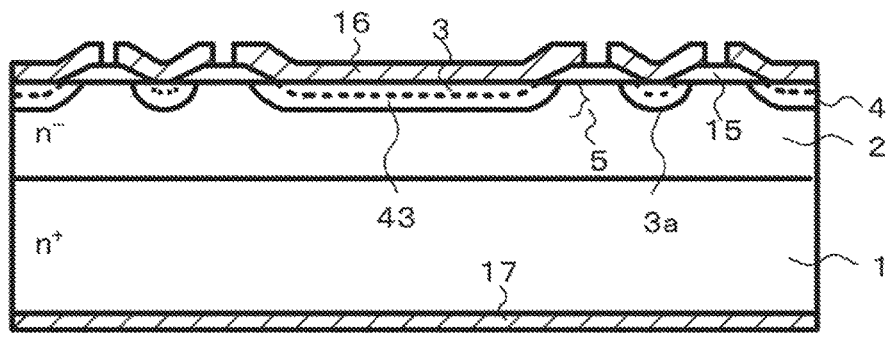
Figure 27:
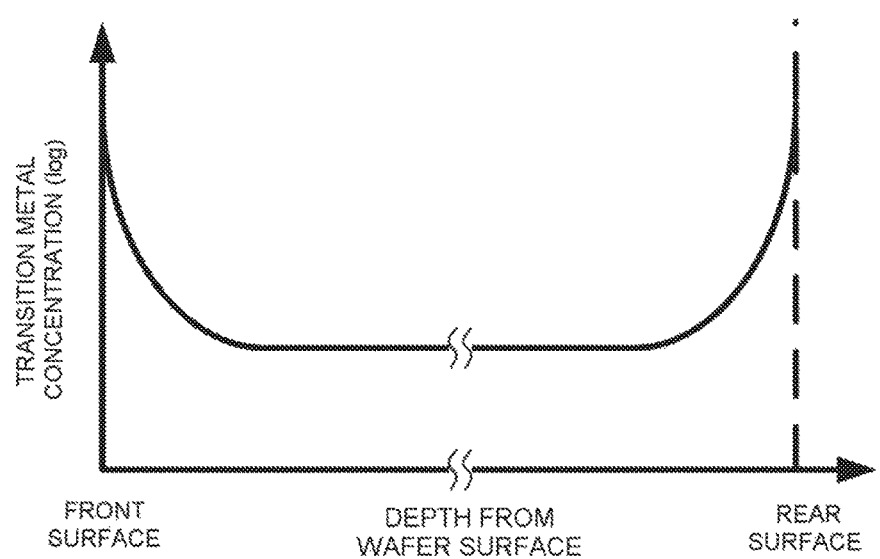
FIG. 27 is a main portion sectional schematic diagram showing the concentration distribution of a transition metal in a semiconductor substrate.

Firstly, n-type drift layer 2 is epitaxially grown to a thickness of 20 μm, with a resistivity of 10 Ωcm, on the upper surface of the low resistance n-type semiconductor substrate 1 including arsenic (As). Next, a transition metal is ion implanted into the upper surface of n-type drift layer 2. It being sufficient that the transition metal is a transition metal that becomes an acceptor in silicon, as previously described, there is, for example, Pt, Pd, Ag, Au, Co, V, Ni, Fe, Cr, or Mn. A condition in which the steps so far are finished is shown in FIG. 26A.

FIG. 26B

Continuing, an oxide film formed by a low pressure CVD method, or an oxide film such as a TEOS film, is deposited on the surface of n-type drift layer 2 into which transition metal 57 has been implanted. The point of this step is to ensure that, when the oxide film is formed, the transition metal implanted in the previous step is not taken into the oxide film. Alternatively, it is sufficient that the amount taken in is sufficiently low. In order to do this, it is preferable to deposit the CVD film or TEOS film at a deposition temperature which is a temperature lower than the diffusion temperature of the transition metal, for example, a temperature lower than 800° C. Then, a plasma treatment is carried out on the oxide film surface for 20 seconds in plasma of a $CF_4+CCl_4$ mixed gas with a power of 300 W. A condition in which the steps so far are finished is shown in FIG. 26B.

FIG. 26C

Next, a portion of the oxide film corresponding to a region in which the active region is formed is removed using a photolithography technique and etching. Continuing, B (boron) is ion implanted into n-type drift layer 2, with the remaining portion of oxide film 15 as a mask. The dose at this time is $5E15/cm^2$, and the accelerating voltage is 50 kV. As the object of the boron ion implantation is to introduce the point defects, the point defects may also be introduced using another previously described method. A condition in which the steps so far are finished is shown in FIG. 26C.

FIG. 26D

Continuing, the ion implanted transition metal is diffused at a temperature of 800° C. to 1,000° C. With a diffusion temperature of this order, the diffusion is carried out without the deposited film (the CVD film, TEOS film, or the like) being transformed. Because of this, the surface vicinity of the active region of n-type drift layer 2 and the surface vicinity of the termination structure region are inverted to p-type, and inversion advancement region 43 is formed. A condition in which the steps so far are finished is shown in FIG. 26D.

FIG. 26E

Continuing, for example, an Al—Si alloy is deposited by sputtering to a thickness of 5 μm on the wafer surface. Then, the Al—Si alloy is patterned to a desired form using a photolithography technique and etching. Subsequently, heat processing is carried out at 500° C. for one hour under an $N_2$ atmosphere, and low resistance anode 16 that comes into contact with p-type region 3 is formed. Anode 16 may also be formed by a vacuum deposition of pure Al. Finally, cathode 17 is formed on the rear surface of n-type semiconductor substrate 1 by depositing titanium (Ti), Ni, and Au using a vacuum deposition or sputtering. For example, the thickness of Ti is 0.7 μm, the thickness of Ni is 0.3 μm, and the thickness of Au is 0.1 μm. A condition in which the steps so far are finished is shown in FIG. 26E.

According to the method of Working Example 18, it is possible to distribute a large amount of the transition metal in the vicinity of p-type anode layer 5. That is, it is sufficient that the acceptor transition of the transition metal affects only the form of p-type anode layer 5, and as a lifetime control function too, provided that the transition metal is concentrated in the vicinity of p-type anode layer 5 in the same way, soft recovery is achievable. Also, with the method of Working Example 18, as the thermal oxide film formation step can be omitted, it is possible to further reduce the manufacturing cost.

In the working examples thus far, a description has been given of cases in which the rated voltage is 300 V and 1,200 V. However, the same advantages can also be achieved with other rated voltages, for example, 600 V, 1,700 V, 3,300 V, or 6,500 V. In particular, with a so-called high breakdown voltage class of 3,300 V or more, the resistivity of the semiconductor substrate is high (100 Ωcm or more). For this reason, the acceptor transition of the transition metal is easily advanced by the point defects.

Thus, a semiconductor device and manufacturing method thereof has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

This application is based on and claims priority to Japanese Patent Application 2010-175498, filed on Aug. 4, 2010. The disclosure of the priority application in its entirety, including the drawings, claims, and the specification thereof, is incorporated herein by reference.

What is claimed is:

1. A semiconductor device, comprising:
a first semiconductor substrate of a first conductivity type;
a second semiconductor layer of a second conductivity type formed on a first main surface side of the first semiconductor substrate so as to come into contact with the first semiconductor substrate, said second semiconductor layer comprising (i) a layer adjacent the first semiconductor substrate which has an electrically activated transition metal in a lattice position of the second semiconductor layer, and (ii) an overlying surface layer which contains an element different than a transition metal;
an anode electrode formed on the first main surface so as to come into contact with the second semiconductor layer, wherein the second semiconductor layer contacts the anode electrode on a surface of an active region;
a third semiconductor layer of the first conductivity type provided on a second main surface of the first semiconductor substrate; and
a cathode electrode formed on the second main surface so as to come into contact with the third semiconductor layer, wherein
the second semiconductor layer includes point defects of a higher concentration than a concentration included in a condition of thermal equilibrium in the semiconductor substrate, wherein said point defects are selected from the group consisting of holes or multi-holes in the lattice, interstitial silicon, interstitial impurities, and substitutional impurities, and wherein the concentration at a condition of thermal equilibrium is the concentration of introduced point defects which remain in silicon of the semiconductor substrate after cooling, and wherein the depth of the point defects is from 0.5 μm to 3.0 μm.

2. The semiconductor device according to claim 1, wherein the concentration of point defects included in the second semiconductor layer is a concentration higher than the concentration of point defects included in the first semiconductor substrate.

3. The semiconductor device according to claim 2, wherein the concentration of point defects included in the second semiconductor layer is $1E15/cm^3$ or more.

4. The semiconductor device according to claim 3, wherein the concentration of point defects included in the second semiconductor layer is $1E18/cm^3$ or less.

5. The semiconductor device according to claim 2, further comprising a point defect layer formed by said point defects at least partially included in the second semiconductor layer.

6. The semiconductor device according to claim 5, wherein the point defect layer includes at least one element selected from the group consisting of He, Ne, Ar, Kr, Xe, and Rn.

7. The semiconductor device according to claim 5, wherein the point defect layer includes at least one element selected from the group consisting of H, O, Li, P, As, Se, and S.

8. The semiconductor device according to claim 5, wherein the point defect layer includes at least one element selected from the group consisting of Pt, Pd, Ag, Au, Co, V, Ni, Fe, Cr, and Mn.

9. The semiconductor device according to claim 5, wherein the point defect layer includes another element in addition to said transition metal.

10. The semiconductor device according to claim 2, wherein the concentration of said point defects is more than $1E3/cm^3$ that is the concentration in thermal equilibrium state.

11. The semiconductor device according to claim 1, wherein the depth at which the concentration of point defects included in the second semiconductor layer becomes equal to the concentration of point defects included in the first semiconductor substrate is 0.1 μm or more and 5.0 μm or less from the first main surface.

12. The semiconductor device according to claim 1, wherein in an end portion of an outer peripheral side of the second semiconductor layer, a curvature radius $L_j$ of the second semiconductor layer in a region in which the concentration of the second semiconductor layer in a depth direction perpendicular to the first main surface gradually decreases toward the outer peripheral side is greater than a depth $r_j$ of the second semiconductor layer.

13. The semiconductor device according to claim 12, wherein in the end portion of the outer peripheral side of the second semiconductor layer, the curvature radius $L_j$ of the second semiconductor layer in the region in which the concentration of the second semiconductor layer in the depth direction perpendicular to the one main surface gradually decreases toward the outer peripheral side is greater than $2r_j$ of the second semiconductor layer.

14. The semiconductor device according to claim 1, wherein the transition metal included in the second semiconductor layer is platinum.

15. The semiconductor device according to claim 1, wherein the point defects include any of B, Al, Ga, or In.

16. The semiconductor device according to claim 1, wherein a fourth semiconductor layer of the second conductivity type having an electrically activated transition metal is formed on the first main surface of a termination structure region, and is formed further to an outer peripheral side than an end portion of an outer peripheral side of the second semiconductor layer, wherein point defects of a higher concentration than the concentration included in a condition of thermal equilibrium are included in the fourth semiconductor layer.

17. The semiconductor device according to claim 1, wherein an insulating film is formed on an upper surface of an end portion of an outer peripheral side of the second semiconductor layer, and a cross-section of the insulating film in the end portion of the second semiconductor layer side is such that an angle formed with the second semiconductor layer has a tapered form smaller than that of an angle formed between the cross-section and the perpendicular direction of the upper surface of the second semiconductor layer.

18. The semiconductor device according to claim 17, wherein the length of a component of the cross-section of the insulating film having the tapered form parallel to the upper surface of the second semiconductor layer is three times or more greater than a depth $r_j$ of the second semiconductor layer.

19. The semiconductor device according to claim 17, wherein the cross-section of the insulating film having the tapered form is of a downward convex toward the first main surface.

20. The semiconductor device according to claim 17, wherein the insulating film having the tapered form includes phosphorus.

21. A semiconductor device, comprising:
a drift layer of a first conductivity type;
an anode layer of a second conductivity type, formed on a first main surface side of the drift layer, and containing an electrically activated transition metal that is in a lattice position of the anode layer, said anode layer comprising (i) a layer adjacent the drift layer which has an electrically activated transition metal in a lattice position of the anode layer,
an anode electrode formed on the one main surface so as to come into contact with the anode layer, wherein the anode layer contacts the anode electrode on a surface of an active region;
a cathode layer of the first conductivity type provided on a second main surface of the drift layer; and
a cathode electrode formed on the second main surface so as to come into contact with the cathode layer,
a point defect layer formed on the first main surface side includes point defects of a higher concentration than the a concentration included in a condition of thermal equilibrium in the drift layer, wherein said point defects are selected from the group consisting of holes (vacancies), multi-holes (divacancies), interstitial silicon, interstitial impurities, and substitutional impurities, and wherein the concentration at a condition of thermal equilibrium is the concentration of introduced point defects which remain in silicon of the semiconductor substrate after cooling, and wherein the depth of the point defects is from 0.5 μm to 3.0 μm.

22. The semiconductor device according to claim 21, wherein the semiconductor device has a region in which the concentration in an end portion of an outer peripheral side of the second semiconductor layer gradually decreases and wherein a curvature radium Lj of the second semiconductor layer to the outer peripheral side in the region is more than three times greater than a depth fj of the anode layer.

* * * * *